US006887591B2

(12) United States Patent
Nukada et al.

(10) Patent No.: US 6,887,591 B2
(45) Date of Patent: May 3, 2005

(54) ORGANIC ELECTROLUMINESCENCE DEVICE

(75) Inventors: Katsumi Nukada, Minamiashigara (JP); Wataru Yamada, Minamiashigara (JP)

(73) Assignee: Fuji Xerox, Co., Ltd., Tokyo (JP)

( * ) Notice: Subject to any disclaimer, the term of this patent is extended or adjusted under 35 U.S.C. 154(b) by 36 days.

(21) Appl. No.: 10/270,675

(22) Filed: Oct. 16, 2002

(65) Prior Publication Data

US 2003/0129451 A1 Jul. 10, 2003

(30) Foreign Application Priority Data

Oct. 18, 2001 (JP) .......................... 2001-320511
Sep. 12, 2002 (JP) .......................... 2002-266704

(51) Int. Cl.$^7$ ............................................. H05B 33/12
(52) U.S. Cl. .................. 428/690; 428/447; 428/448; 428/917; 313/504; 313/506
(58) Field of Search ................. 428/690, 917, 428/447, 448; 313/504, 506

(56) References Cited

U.S. PATENT DOCUMENTS 6,143,433 A * 11/2000 Murata et al. ............... 428/690
6,534,198 B1 * 3/2003 Ueno et al. ................. 428/690

FOREIGN PATENT DOCUMENTS

| JP | A-63-295695 | 12/1988 |
| JP | A-4-220995 | 8/1992 |
| JP | A-4-308688 | 10/1992 |
| JP | A-4-320483 | 11/1992 |
| JP | A-9-279135 | 10/1997 |
| JP | A-11-217392 | 8/1999 |
| JP | A-2000-80167 | 3/2000 |
| JP | A-2000-080167 | 3/2000 |

OTHER PUBLICATIONS

Machine Assisted Translation for JP 11–217392 A published Aug. 1998 (translation done by Derwent on Jul. 12, 2004).*

Machine Assisted Translation for JP 2000–80167–A published Mar. 2000 (translation done by Derwent on Jul. 13, 2004).*

Applied Organometallic Chemistry, Dec. 2001, vol. 15, pp. 939–946.*

C.W. Tang and S.A. VanSlyke, *Organic Electroluminescent Diodes*, Appl. Phys. Lett. 51 (12), Sep. 21, 1987, pp. 913–915, American Institute of Physics.

T. Inagaki, T. Kubuki, T. Mori and T. Mitzutani, *Characterization of Organic/Inorganic Composite LED with Dye–doped Semiconductor Layer* (1), Nagoya University, Department of Technology 28p–V–15, no date.

T. Dantas de Morais, F. Chaput, K. Lahlil and J. Boilot, *Hybrid Organic–Inorganic Light–Emitting Diodes*, Advanced Materials, 1999, LI, No. 2, 107–112.

W. Li et al., *Covalently Interlinked Organic LED Transport Layers via Spin–Coating/Siloxane Condensation*, Advanced Materials, 1999, 11, No. 9, 730–734.

* cited by examiner

*Primary Examiner*—Dawn Garrett
(74) *Attorney, Agent, or Firm*—Oliff & Berridge, PLC

(57) ABSTRACT

The present invention is an organic electroluminescence device having one or two or more organic film layers formed on the surface of the substrate such that the organic film layer is held by an anode and a cathode, wherein at least one of the organic film layers is a layer comprising a cross-linked cured film containing compounds having a substituted silicon group having a hydrolyzable group, or a derivative thereof, and at least one of the compounds having a substituted silicon group having the hydrolysable group is a compound represented by the following general formula (I):
General Formula (I)

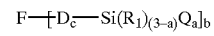

The present organic electroluminescence device can be driven at a low voltage and a high light-emission efficiency, has the better heat resistance, and maintain the stable light-emitting property for a long period of time. In addition, the present organic electroluminescence device can be obtained by lamination by solution coating.

21 Claims, 2 Drawing Sheets

ORGANIC ELECTROLUMINESCENCE DEVICE

BACKGROUND OF THE INVENTION

1. Field of the Invention

The present invention relates to an organic electroluminescence device having an organic film layer.

2. Description of the Related Art

As a film type electroluminescence (hereinafter, the term "electroluminescence" may occasionally be referred to as "EL") device, devices in which ZnS, CaS, SrS and the like, which are inorganic materials and specifically II–VI group compound semiconductors, are doped with Mn of an emission center or a rare earth element (Eu, Ce, Tb, Sm etc.), are generally used. However, EL devices made from the aforementioned inorganic material have a problem that 1) alternating current driving is necessary (generally, 50 to 1000 Hz), 2) a driving voltage is high (generally, around 200 V), 3) full colorization is difficult and, in particular, blue emitting is problematic, and 4) the cost of a peripheral driving circuit is high.

On the contrary, in organic EL devices using an organic compound as a light-emitting layer and the like, a driving voltage can be considerably reduced, the size of the device can be easily made compact, consumed power is small, plane emitting is possible, and three primary colors emission is easy. Therefore, organic EL devices are being keenly studied and exploited as a next generation light-emitting device. In particular, the light-emission efficiency of the recent organic EL devices has significantly been enhanced, as compared with that of the conventional EL devices using a single crystal of anthracene and the like, as a result of the development of organic EL devices having a laminated structure in which the effect of injecting carriers from an electrode is enhanced by optimization of an electrode species, and a hole transporting layer consisting of aromatic diamine and a light-emitting layer consisting of an aluminum complex of 8-hydroxyquinoline are provided (refer to, for example, non-patent reference 1 described below).

Further, in order to prolong the device life, research on various materials was made. For example, as a material for a hole injecting layer, porphyrin derivatives and phthalocyanine compounds (for example, see patent reference 1 below), star burst type aromatic triamine (for example, see patent reference 2 below), hydrazone compounds (see, patent reference 3 below), alkoxy-substituted aromatic diaimne derivatives (for example, see patent reference 4 below), p-(9-anthryl)-N,N-di-p-tolylaniline and the like have been exploited, which, to some extent, exhibit properties applicable to actual use. Further, besides electroluminescence devices using the aforementioned low-molecular materials, exploitation of EL devices using a polymer material such as poly(p-phenylenevinylene), poly[2-methoxy-5-(2-ethylhexyloxy)-1,4-phenylenevinylene], poly(3-alkylthiophene) and the like as a material for a light-emitting layer, and exploitation of devices in which a low-molecular light-emitting material and an electron transferring material are mixed into a polymer such as polyvinylcarbazole and the like, have been made.

As the construction of an organic EL device, the structure including anode/organic light-emitting layer/cathode in this order is the basic construction. A construction in which a hole injecting-transporting layer and an electron injecting layer are further provided in an appropriate manner, to the aforementioned basic construction, is also known. Specifically, for example, a construction including anode/hole injecting-transporting layer/organic light-emitting layer/cathode in this order and a construction including anode/hole injecting-transporting layer/organic light-emitting layer/electron injecting layer/cathode in this order are known.

The greatest task in exploitation of the aforementioned organic EL device is prolongation of life at driving. Examples of the problematic phenomenon at driving include reduction in the luminance, rise in voltage at constant current driving, occurrence of a non-emitting part (dark spot) and the like. Although there are some causes for these occurrences, deterioration of a film shape in an organic layer is the main cause. This deterioration of a film shape is thought to be derived from crystallization (or aggregation) of an organic amorphous film due to heat generation at device driving and the like.

By the way, as a material for an organic EL device, an organic low-molecular compound and an oligomer are conventionally used by vacuum deposition in many cases. However, the organic low-molecular compound and the oligomer have the low heat resistance and, therefore, improvement of them have been sought. For the purpose of preventing such defects due to crystallization and the like from occurring, polymerizing the aforementioned organic low-molecular compound has been attempted, to improve the thermal stability. Specifically, an attempt to improve the heat resistance has been made by using a polymer having a particular structure.

Further, study of impartment of the higher heat resistance by three-dimensionally cross-linking the aforementioned polymer or the like was also studied, and there is disclosed that a compound having an alkoxysilyl group is heated to cure by a sol-gel method (see patent references 5 and 6, and non-patent references 2 to 4 below).

[Patent Reference 1]
Japanese Patent Application Laid-Open (JP-A) No. 63-295695
[Patent Reference 2]
JP-A No. 4-308688
[Patent Reference 3]
JP-A No. 4-320483
[Patent Reference 4]
JP-A No. 4-220995
[Patent Reference 5]
JP-A No. 9-279135
[Patent Reference 6]
JP-A No. 2000-80167
[Non-Patent Reference 1]
Appl. Phys. Lett., 51,913, (1987)
[Non-Patent Reference 2]
56$^{th}$ Applied physics Annual Meeting Pre-Manuscript, Vol. 3, p.1031 (1995)
[Non-Patent Reference 3]
Adv. Mater., 11, No.2 (1999)
[Non-Patent Reference 4]
Adv. Mater., 11, No.9 (1999)

A film cured by heating by the aforementioned sol-gel method is not only excellent in the heat resistance but also excellent in the adherability with an inorganic electrically-conducting film such as ITO to which the prior art organic materials have the poor adherability, and is very effective as a hole or electron injecting layer. In addition, since the above film can be coated with a solvent which does not dissolve a polymer, such as alcohol and the like, it has the characteristics that lamination and coating on the surface of a small molecule or a polymer is also easy. However, on the other hand, it is difficult to completely remove a water molecule produced as a result of condensation from a film, and there is a problem that corrosion of an electrode by a moisture in a film easily occurs in a long term use.

SUMMARY OF THE INVENTION

The present invention was done in view of the aforementioned circumstances, and an object of the invention is to provide an organic electroluminescence device which can be driven at a low voltage and a high light-emission efficiency, has the better heat resistance, and can maintain the stable light-emitting property for long period of the time. Another object of the invention is to obtain the organic electroluminescence device by lamination by solution coating.

In order to solve the problems of the prior art and provide an organic EL device which can maintain the stable light-emitting property at a high temperature, the present inventors intensively studied. As a result, the inventors have discovered that a water molecule is present in a film cured by heating by a sol-gel method because of absorption of a moisture by a remaining silanol group (—SiOH), or generation of a moisture due to gradual progression of a dehydration reaction between remaining silanol groups, and that this phenomenon is derived from a structure of a Si group having a silanol group. That is, when a trialkoxysilyl group is used, a structure is formed in which three OH groups are bound to one Si, and silanol groups easily remain even after a cross-linking reaction. To the contrary, when a compound represented by the following general formula (I) is used, the absolute number of silanol groups can be reduced and, at the same time, the hydrophobicity can be imparted to a cross-linked cured film by $R_1$ and, therefore, absorption of a moisture can be reduced, and the aforementioned problem can be solved.

Specifically, the essential features of the invention for solving the aforementioned problem are the following <1> to <4>. That is:

<1> an organic electroluminescence device comprising a substrate, and one or two or more organic film layers formed on the surface of the substrate such that the organic film layers are held by an anode and a cathode, wherein at least one layer of the organic film layers is a layer comprising a cross-linked cured film containing a compound having a substituted silicon group having a hydrolyzable group, or a derivative thereof, and at least one of the compounds having a substituted silicon group having the hydrolyzable group is a compound represented by the following general formula (I).

General Formula (I)

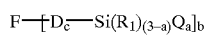

$$F\text{—}[D_c\text{—}Si(R_1)_{(3-a)}Q_a]_b$$

In the formula, F represents an organic group derived from a photofunctional compound. D represents a divalent tethering group. $R_1$ represents hydrogen, an alkyl group, a substituted or unsubstituted aryl group, and Q represents a hydrolyzable group. "a" is 1 or 2, "b" is an integer of 1 to 4, and "c" is 0 or 1.

<2> In the organic electroluminescence device described in the above <1>, all of the compounds having a substituted silicon group having the aforementioned hydrolyzable group are a compound represented by the above general formula (I).

<3> In the organic electroluminescence device described in either of the above <1> or <2>, an organic group F derived from a photofunctional compound, of a compound represented by the above general formula (I) or a derivative thereof, is an organic group derived from a compound represented by the following general formula (II):

General Formula (II)

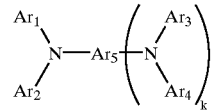

In the formula, $Ar_1$ to $Ar_4$ represent independently a substituted or unsubstituted aryl group, $Ar_1$ and $Ar_2$, and $Ar_3$ and $Ar_4$ may form a ring, respectively, and $Ar_5$ represents a substituted or unsubstituted aryl group or arylene group, and 1 to 4 of $Ar_1$ to $Ar_5$ have a bond which can bind to a binding group represented by —$D_c$—$Si(R_1)_{(3-a)}Q_a$ in the above general formula (I). k is 0 or 1.

<4> In the organic electroluminescence device described in any of the above <1> to <3>, two or more layers, of the layers comprising a cross-linked cured film containing a compound having a substituted silicon having the aforementioned hydrolyzable group or a derivative thereof, are provided as the organic film layer.

DETAILED DESCRIPTION OF THE PREFERRED EMBODIMENT

Figure 1:
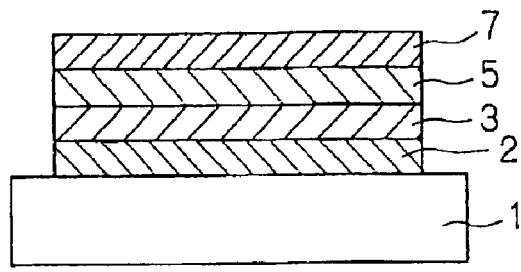
FIG. 1 is an enlarged cross-section showing one example of the organic electroluminescence device of the invention.
Figure 2:
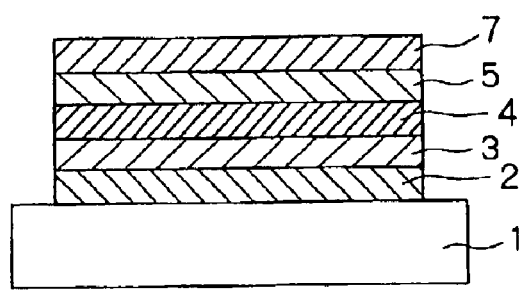
FIG. 2 is an enlarged cross-section showing one example of the organic electroluminescence device of the invention.
Figure 3:
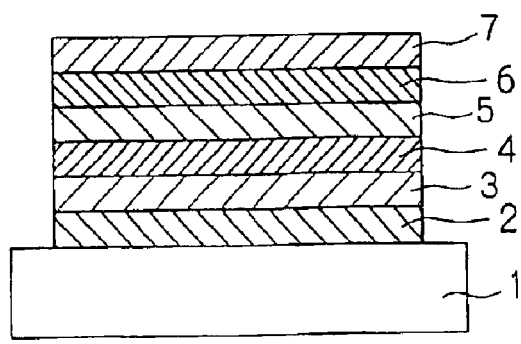
FIG. 3 is an enlarged cross-section showing one example of the organic electroluminescence device of the invention.

The organic EL device of the present invention will be described in detail below referring to the drawings. FIGS. 1 to 3 are a schematic cross-section showing an embodiment of an organic EL device of the present invention, 1 represents a substrate, 2 represents an anode, 3 represents a hole injecting layer, 4 represents a hole transporting layer, 5 represents a light-emitting layer, 6 represents an electron transporting layer, and 7 represents a cathode, respectively, but device constructions are not limited to the structure shown in the drawings. Each constituent will be specifically explained below.

-Substrate-

A substrate 1 is a support for an organic EL device, and a plate of quartz or glass, a metal plate and a metal foil, and a plastic film and sheet are used. In particular, a glass plate, a plate of a transparent synthetic resin such as polyester, polymethacrylate, polycarbonate and polysulfone are preferable. When a synthetic resin substrate is used, attention must be paid to the gas barrier property. When the gas barrier property of a substrate is too low, an organic EL device tends to be deteriorated by the air outside passing through the substrate, which is not preferable. For this reason, according to one preferable embodiment, a dense silicon oxide film or the like is provided on an either side or on both sides of a synthetic resin substrate, to maintain the gas barrier property.

-Anode-

An anode 2 is usually provided on the surface of a substrate 1. When a substrate 1 has the electrically-conducting property, the substrate 1 may serve also as an anode 2. An anode 2 plays a role in injecting holes into a hole injecting layer 3. This anode 2 is usually composed of a metal such as aluminum, gold, silver, nickel, palladium, platinum and the like, a metal oxide such as oxide of indium and/or tin, a halogenated metal such as copper iodide, carbon black or the like. An anode 2 is usually formed by an sputtering method, a vacuum deposition method and a plating method. Alternatively, an anode 2 may be formed by dispersing a metal fine particle such as silver, a fine particle such as copper iodide, carbon black, an electrically-conducting metal oxide fine particle or the like in a suitable binder resin solution, and coating the solution on the surface of substrate 1. An anode 2 can be also formed by laminating different materials.

A thickness of an anode 2 is different depending on the required transparency. Since the higher transparency is generally desirable, the transmittance of the visible light is preferably 60% or larger, more preferably 80% or larger. In this case, a thickness is preferably 10 to 1000 nm, more preferably around 20 to 500 nm. When both electrodes are made opaque for the purpose of reflecting the light between both electrodes for laser oscillation from an end, a thicker metal-deposited membrane or the like than described above may be provided on the surface of a substrate 1, or a substrate 1 having the electrically-conducting property may serve also as anode 2 as described above. Alternatively, different electrically-conducting materials may be laminated on the surface of the aforementioned anode 2.

-Organic Film Layer-
<Hole Injecting Layer>

In the device structures of FIGS. 1 to 3 exemplified as a representative of the invention, a hole injecting layer 3 is provided on the surface of an anode 2. As the conditions required for materials used in this hole injecting layer 3, the efficiency in injecting holes from an anode 2 is to be high, and injected holes are to be effectively transported. For that, it is required that ionization potential is small, the transparency to the visible light is high, the hole mobility is great, and further the stability is excellent, and impurities serving as a trap are less likely to be generated at manufacture or in use. In addition, besides the aforementioned general conditions, when an application to motorcar displays is considered, the heat resistance of 100° C. or higher, more preferably 120° C. or higher are required for all organic film layers including a hole injecting layer. Materials which are preferably used in a hole injecting layer will be described in detail below.

A thickness of a hole injecting layer 3 is preferably 5 to 3000 nm, more preferably 10 to 2000 nm.

Additionally, apart from a hole injecting layer, a hole transporting layer described below is provided in some cases. However, a hole injecting layer serves also as a hole transporting layer in some cases. In these cases, both the hole injecting layer and the hole transporting layer are often collectively referred to as a hole injecting transporting layer.

<Light-emitting Layer, Hole Transporting Layer, Electron Transporting Layer, Electron Injecting Layer>

In the device structure of FIG. 1, a light-emitting layer 5 is provided on the surface of a hole injecting layer 3. The light-emitting layer 5 is formed by a material which effectively recombines electrons injected from a cathode 7 and holes transported from a hole injecting layer 3 between electrodes to which the electric filed is applied, and effectively emits the light by recombination. A thickness of the light-emitting layer 5 is preferably 10 to 200 nm, more preferably 30 to 100 nm.

In the invention, in order to improve the light-emitting property of a device, a structure for separating the functions may be formed by providing a hole transporting layer 4 between a hole injecting layer 3 and a light-emitting layer 5 as shown in FIG. 2, and further by providing an electron transporting layer 6 between a light-emitting layer 5 and a cathode 7 as shown in FIG. 3. In the function-separated-type devices of FIG. 2 and FIG. 3, a material for the hole transporting layer 4 is required to be a material in which the effects of injecting holes from a hole injecting layer 3 is high and injected holes can be effectively transported. For that, it is required that ionization potential is small, and a hole mobility is large, and the stability is excellent, and impurities serving as a trap are less likely to be generated at manufacture or use.

Then, a method of forming each layer of the present organic EL device will be described in detail below.

1. Formation of a Layer in the Case Where a Compound Having a Substituted Silicon Group Having a Hydrolyzable Group is Not Contained In the present organic EL device of the invention, among organic film layers, at least one layer comprises a cross-linked cured film containing a compound having a substituted silicon group having a hydrolyzable group or the like. Herein, an organic film layer containing no relevant compound or the like is formed according to the known method as follows:

Besides a compound represented by the aforementioned general formula (I) used in the invention, examples of a material which can be used in a hole injecting layer 3 or a hole transporting layer 4 include the known materials such as aromatic diamine compounds connected to a tertiary aromatic amine unit such as 1,1-bis(4-di-p-tolylaminophenyl)cyclohexane and the like (JP-A No. 59-194393 gazette), aromatic amine containing 2 or more tertiary amines, a representative of which is 4,4'-bis[N-(1-naphthyl)-N-phenylamino]biphenyl, and in which 2 or more condensed aromatic rings are substituted with nitrogen atoms (JP-A No. 5-234681 gazette), aromatic triamine having a star burst structure, which is a derivative of triphenylbenzene (U.S. Pat. No. 4,923,774 specification), aromatic diamine such as N,N'-diphenyl-N,N'-bis(3-methylphenyl) biphenyl-4,4'-diamine and the like (U.S. Pat. No. 4,764,625 specification), triphenylamine derivatives which are sterically asymmetric as a whole molecule (JP-A No. 4-129271 gazette), compounds in which a pyrenyl group is subjected to substitution with a plurality of aromatic diamino groups (JP-A No. 4-175395 gazette), aromatic diamine tethering a tertiary aromatic amine unit with an ethylene group (JP-A No. 4-264189 gazette), aromatic diamine having a styryl structure (JP-A No. 4-290851 gazette), a compound in which an aromatic tertiary amine unit is connected with a thiophene group (JP-A No. 4-304466 gazette), star burst type aromatic triamine (JP-A No. 4-308688 gazette), benzylphenyl compound (JP-A No. 4-364153 gazette), compounds in which a tertiary amine is connected with a fluorene group (JP-A No. 5-25473 gazette), triamine compounds (JP-A No. 5-239455 gazette), bisdipyridylaimnobiphenyl (JP-A No. 5-320634 gazette), N,N,N-triphenylamine derivatives (JP-A No. 6-1972 gazette), aromatic diamine having a phenoxazine structure (JP-A No. 7-138562 gazette), diaminophenylphenanthridine derivatives (JP-A No. 7-252474 gazette), silazane compounds (U.S. Pat. No. 4,950,950 specification), silanamine derivatives (JP-A No. 6-49079 gazette), phosphamine derivatives (JP-A No. 6-25659 gazette) and the like. These compounds may be used alone or, if needed, by mixing 2 or more.

Besides the aforementioned compounds, examples of a material for a hole transporting layer 4 include polymer materials such as electrically-conducting polymers and the like such as polyvinylcarbazole, polysilane and polyphosphazene (JP-A No. 5-310949 gazette), polyamide (JP-A No. 5-310949 gazette), polyvinyltriphenylamine (JP-A No. 7-53953 gazette), polymers having a triphenylamine skeleton (JP-A No. 4-133065 gazette), and polymethacrylate and polyaniline containing aromatic amine.

Besides the compounds represented by the aforementioned general formula (I) used in the invention, examples of a material used in the light-emitting layer 5 and the electron transporting layer 6 include the known materials, such as metal complexes like aluminum complex of 8-hydroxyquinoline (JP-A No. 59-194393 gazette), metal complexes of 10-hydroxybenzo[h]quinoline (JP-A No. 6-322363 gazette), bisstyrylbenzene derivatives (JP-A Nos. 1-245087 gazette, 2-222484 gazette), bisstyrylarylene derivatives (JP-A No. 2-247278 gazette), metal complexes of (2-hydroxyphenyl)benzothiazole (JP-A No. 8-315983 gazette), silol derivatives and oxadiazole derivatives (Appl. Phys. Lett., 55, 1489, (1989)) and the system in which the derivatives are dispersed in a resin such as methyl polymethacrylate (PMMA) and the like, and phenanthroline derivatives (JP-A No. 5-331459 gazette), 2-t-butyl-9,10-N, N'-dicyanoanthraquinonediimine, n type hydrogenated amorphous silicon carbide, n-type zinc sulfide, n type zinc selenide and the like. These compounds may be used alone or, if needed, by mixing 2 or more.

For the purpose of improving the efficiency in a light-emission device and, at the same time, changing the emitted light color, aluminum complexes of 8-hydroxyquinoline as a host material, for example, have been doped with a laser fluorescent dye such as coumarine and the like (J. Appl. Phys., 65,3610, (1989)). Examples of advantages of this method are that 1) the light-emission efficiency is improved by a fluorescent dye having a high light-emission efficiency, 2) an emitting wavelength can be varied by selecting a fluorescent dye, 3) a fluorescent dye which causes concentration quenching can be also used, 4) a fluorescent dye which exhibits difficulty in being prepared into a film, can be also used, and so on.

Also, for the purpose of improving a driving life of a device, it is effective to dope a fluorescent dye using the aforementioned light-emitting layer material as a host material. The light-emitting property, in particular, the driving stability can be considerably improved by doping a naphthacene derivative, a representative of which is rubrene (JP-A No. 4-335087 gazette), a qionacridone derivative (JP-A No. 5-70773 gazette), a condensed polycyclic aromatic ring such as perylene and the like (JP-A No. 5-198377 gazette) into a host material at 0.1 to 10% by mass, using metal complexes such as aluminum complex of 8-hydroxyquinoline as a host material.

As a method of doping a host material of a light-emitting layer 5 with a fluorescent dye such as aforementioned naphthacene derivative, quinacridone derivative, perylene and the like, there are the method by codeposition and a method of mixing deposition sources at a predetermined concentration in advance.

Examples of a polymer systems for light-emitting layer material include polymer materials such as the aforementioned poly(p-phenylenevinylene), poly[2-methoxy-5-(2-ethylhexyloxy)-1,4-phenylenevinilene], poly(3-alkylthiophene) and the like, systems in which a light-emitting material and an electron transferring material are mixed into a polymer such as polyvinylcarbazol and the like.

When a hole injecting layer 3, a hole transporting layer 4, a light-emitting layer 5 and an electron transporting layer 6 are formed by solution coating using the aforementioned materials, a binding resin may be used. The binding resin can be selected among a variety of insulating resins. Preferable examples of the binding resin include a polyvinyl butyral resin, a polyarylate resin (polycondensed resin of bisphenol A and phthalic acid etc.), a polycarbonate resin, a polyester resin, a phenoxy resin, a vinyl chloride resin, a vinyl chloride-vinyl acetate copolymer, a vinylidene resin, a polystyrene resin, a polyamide resin, an acrylic resin, an polyacrylamide resin, a polyvinyl acetate resin, a polyvinylpyridine resin, a cellulose resin, an urethane resin, an epoxy resin, casein, a polyvinyl alcohol resin, a polyvinylpyrrolidone resin, a silicone resin and the like, being not limiting. In addition, these binding resins may be used alone or by mixing 2 or more.

A mass ratio (A:B) of a mass A of a hole injecting and hole transporting layer material, a light-emitting and electron transporting layer material or a light-emitting and electron injecting layer material and a mass B of a binding resin is preferably in a range of 90:10 to 10:90 in a hole injecting and transporting layer. In addition, it is preferable that the ratio is in a range of 90:10 to 10:90 in a light-emitting and electron transporting layer or a light-emitting and electron injecting layer.

Further, as a solvent, common organic solvents such as alcohols such as methanol, ethanol, n-propanol and the like; esters such as methyl acetate, n-butyl acetate and the like; aromatic hydrocarbons such as benzene, toluene, xylene, chlorobenzene and the like; ketones such as acetone, 2-butanone and the like; halogenated aliphatic hydrocarbons such as methylene chloride, chloroform, ethylene chloride and the like; cyclic or straight ethers such as tetrahydrofuran, ethyl ether and the like; and the like may be used alone or by mixing 2 or more.

The aforementioned hole injecting layer 3, hole transporting layer 4, light-emitting layer 5 and electron transporting layer 6 are solution-coated normally by a method such as a vacuum deposition method, a spin coating and the like, to form a film. When a vacuum deposition method is used, desired materials are placed in a crucible disposed in a vacuum container, the interior of a vacuum container is evacuated to around $10^{-4}$ Pa with a suitable vacuum pomp, a crucible is heated to evaporate materials, to form a film on the surface of a substrate which is disposed facing a crucible.

When a solution coating method is used, desired materials are dissolved in a solvent at a desired concentration, and a solution is coated with a method such as spin coating, dip coating and ink jet. In this case, since it is necessary to avoid dissolution of a lower layer by wet-on-wet coating of each layer, or it is necessary to render an interface of each layer as clear as possible for enhancing the efficiency in injecting holes or electrons, it is preferable that a solvent which does not substantially dissolve a lower layer is used. However, if a lower layer is a three-dimensionally cross-linked layer as the case where a compound having a substituted silicon group of the invention is used in a lower layer, since the surface of a lower layer has the high resistance to a solvent, a solvent for coating can be selected among a wide range.

2. Formation of a Layer in the Case Where a Compound Having a Substituted Silicon Group Having a Hydrolyzable Group is Contained In the invention, it is necessary that, among the aforementioned hole injecting layer 3, hole transporting layer 4, light-emitting layer 5, and electron transporting layer 6, at least one layer is a layer comprising a cross-linked cured film containing a compound having a substituted silicon group having a hydrolyzable group or a derivative thereof, and at least one compound having a substituted silicon group having a hydrolyzable group is a compound represented by the following general formula (I).

General Formula (I)

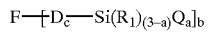

$$F\text{---}[D_c\text{---}Si(R_1)_{(3-a)}Q_a]_b$$

In the formula, F represents an organic group derived from a photofunctional compound. D represents a divalent tethering group. R1 represents hydrogen, an alkyl group, or a substituted or unsubstituted aryl group, and Q represents a hydrolyzable group. a is 1 or 2, b is an integer of 1 to 4, and c is 0 or 1.

Herein, a compound having a substituted silicon group having a hydrolysable group is a compound having 1 or more substituted silicon groups having a hydrolyzable group, and a cross-linked cured film containing the compound or a derivative thereof is a cross-linked cured film containing at least 1 type of those compounds, or derivatives thereof.

In a substituted silicon group having a hydrolyzable group constituting a cross-linked cured film, it is preferable that a in the general formula (I) is 1 or 2, that is, the number of hydrolyzable group Q is 1 or 2. It is more preferable that a is 2. When a is less than 1, that is, 0, since a hydrolyzable group Q is not present, a cross-linked structure is not formed. When a exceeds 2, that is, 3, three hydrolyzable groups Q are present in Si, and a silanol group easily remains even after a cross-linking reaction. Therefore, in the case where a is 2, the most balanced structure is obtained from a viewpoint that a coating film is suitably cross-linked and the remaining silanol group is reduced.

In addition, in a cross-linked cured film, in order to minimize the influence of the aforementioned remaining silanol group, it is preferable that all the aforementioned substituted silicon groups having a hydrolyzable group are a group represented by the general formula (I).

Further, when the compound represented by the formula (I) is used, it is preferable that at least one of the relevant compounds has 2 or more substituted silicon groups in a molecule, that is, it is a compound wherein b in the general formula (I) is 2 or more, from a viewpoint that a cross-linking degree of a coating film is enhanced.

In the invention, it is preferable that a compound itself having a substituted silicon group constituting the aforementioned cross-linked film has by itself the hole transporting property, the light-emitting property and the electron transporting property. For that, it is preferable that F in the general formula (I) is a group having the hole transporting ability or a group having the electron transporting ability. In particular, examples of a group having the hole transporting ability include a triarylamine-based compound, a benzidine-based compound, an arylalkane-based compound, an aryl-substituted ethylene-based compound, a stilbene-based compound, an anthracene-based compound, and a hydrazone-based compound, as well as the structure having the light carrier transporting property such as a quinone-based compound, fluorenone compound, a xanthone-based compound, a benzophenone-based compound, a cyanovinyl-based compound and an ethylene-based compound. Examples of a group having the electron transporting ability include organic derivatives derived from a quinone-based compound, a fluorenone-based compound, a xanthone-based compound, a benzophenone-based compound, a cyanovinyl-based compound and an ethylene-based compound.

$-Si(R_1)_{(3-a)}Q_a$ in the general formula (I) represents a substituted silicon group having a hydrolyzable group, this substituted silicon group is for causing a cross-linking reaction mutually to form a three-dimensional Si—O—Si linkage, that is, an inorganic vitreous network with a Si group.

D in the general formula (I) is for binding F for imparting the photoelectric property into a three-dimensional inorganic vitreous network. A divalent tethering group represented by the D is not necessary when a group represented by F and a group represented by $-Si(R_1)_{(3-a)}Q_a$ are directly bound (i.e., when C=0 in the general formula (I)), and the divalent tethering group functions to impart the suitable flexibility to an inorganic vitreous network having stiffness and, conversely, brittleness, and to convert a film into amorphous to improve the film forming property. In addition, when a tethering group represented by D is provided, there is an advantage that the solubility and the compatibility of the compound represented by the general formula (I) are improved.

Specifically, a divalent hydrocarbon group represented by $-C_nH_{2n}-$, $-C_nH_{(2n-2)}-$ or $-C_nH_{(2n-4)}-$ in which n is an integer of 1 to 15, $-COO-$, $-S-$, $-O-$, $-CH_2-C_6H_4-$, $-N=CH-$, $-(C_6H_4)-(C_6H_4)-$, and a combination thereof, and those with a substituent introduced are used.

Among the compounds represented by the general formula (I), a compound wherein F is represented by the general formula (II) exhibits the particularly excellent hole transporting property and the mechanical property, which is preferable.

General Formula (II)

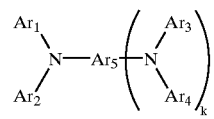

In the general formula (II), $Ar_1$ to $Ar_4$ represents independently a substituted or unsubstituted aryl group, and $Ar_5$ represents a substituted or unsubstituted aryl group or arylene group, wherein 1 to 4 of $Ar_1$ to $Ar_5$ have a bond which can bind to a binding group represented by $-D_c-Si(R_1)_{(3-a)}Q_a$ in the aforementioned general formula (I). k represents 0 or 1.

As the $Ar_1$ to $Ar_4$ in the general formula (II), those listed in the following structure group 1 are preferable.

Structure group 1

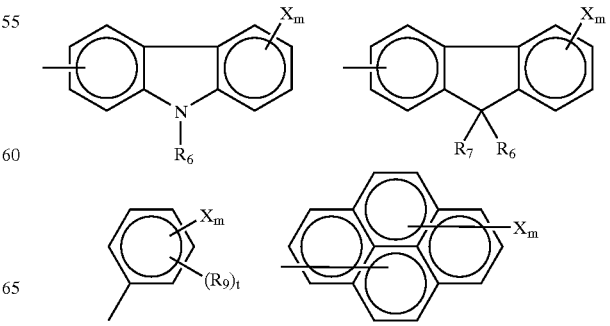

-continued

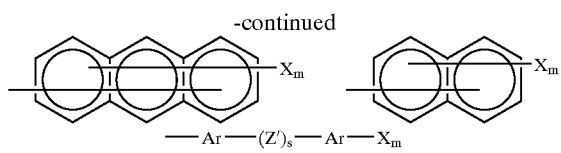

As the Ar in the aforementioned structure group 1, those listed in the following structure group 2 are preferable.

Structure group 2

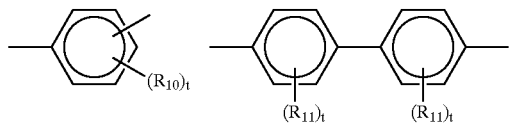

In addition, as the Z' in the aforementioned structure group 1, those listed in the following structure group 3 are preferable.

Structure group 3

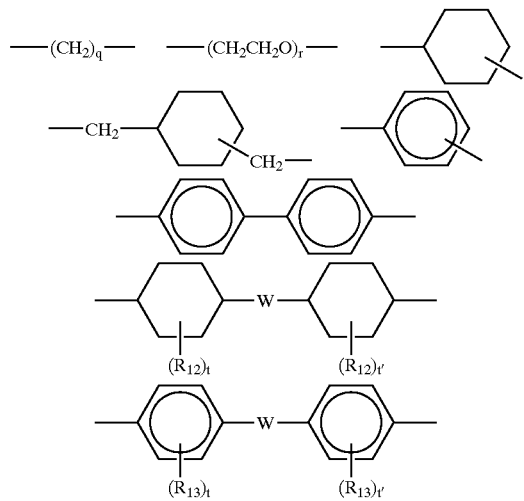

Herein, $R_6$ represents hydrogen, an alkyl group having a carbon number of 1 to 4, a phenyl group substituted with an alkyl group having a carbon number of 1 to 4 or an alkoxy group having a carbon number of 1 to 4, an unsubstituted phenyl group, or an aralkyl group having a carbon number of 7 to 10. $R_7$ to $R_{13}$ represent hydrogen, an alkyl group having a carbon number of 1 to 4, an alkoxy group having a carbon number of 1 to 4, a phenyl group substituted with an alkoxy group having a carbon number of 1 to 4, an unsubstituted phenyl group, an aralkyl group having a carbon number of 7 to 10, or halogen. m and s represent independently 0 or 1, q and r represent independently an integer of 1 to 10, and t and t' represent independently an integer of 1 to 3. Herein, X is the same —$D_c$—$Si(R_1)_{(3-a)}Q_a$ as that already denoted in the definition of the general formula (I).

In addition, as the W in the aforementioned structure group 3, those listed in the following structure group 4 are preferable.

Structure group 4

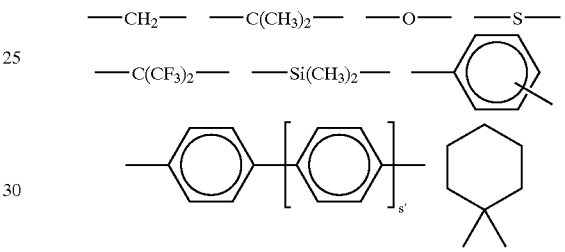

Herein, s' represents an integer of 0 to 3.

As the specific structure of $Ar_5$ in the general formula (II), there are the structures of the aforementioned $Ar_1$ to $Ar_4$ in which m=1 when k=0, and the structures of the aforementioned $Ar_1$ to $Ar_4$ in which m=0 when k=1. Examples of the compound of the general formula (II) are shown in Tables 1 to 17 by specifying each substituent, being not limiting. In Tables, Me represents a methyl group, Et represents an ethyl group, Ph represents a phenyl group, and iPr represents an isopropyl group.

TABLE 1

| compound | k | Ar$^1$ | Ar$^2$ | Ar$^3$ | Ar$^4$ | Ar$^5$ | X |
|---|---|---|---|---|---|---|---|
| 1 | 0 | 2,3-dimethylphenyl | biphenyl | — | — | phenyl-X | —CH=NCH$_2$—<br>—Si(OMe)$_2$Me |
| 2 | 0 | 2,3-dimethylphenyl | biphenyl | — | — | phenyl-X | —CH=N(CH$_2$)$_3$—<br>—SiMe$_2$(OMe) |
| 3 | 0 | 2,3-dimethylphenyl | biphenyl | — | — | phenyl-X | —O(CH$_2$)$_3$—<br>—SiMe(OMe)$_2$ |

TABLE 1-continued

| compound | k | Ar¹ | Ar² | Ar³ | Ar⁴ | Ar⁵ | X |
|---|---|---|---|---|---|---|---|
| 4 | 0 | 2,4-dimethylphenyl | biphenyl-4,4'-diyl | — | — | 1,4-phenylene-X | —O(CH$_2$)$_3$—<br>—SiMe$_2$(OMe) |
| 5 | 0 | 2,4-dimethylphenyl | biphenyl-4,4'-diyl | — | — | 1,4-phenylene-X | —CH$_2$O(CH$_2$)$_3$—<br>—SiMe(OMe)$_2$ |
| 6 | 0 | 2,4-dimethylphenyl | 2,4-dimethylphenyl | — | — | biphenyl-4,4'-diyl-X | —COO(CH$_2$)$_3$—<br>—SiMe(OMe)$_2$ |

TABLE 2

| compound | k | Ar¹ | Ar² | Ar³ | Ar⁴ | Ar⁵ | X |
|---|---|---|---|---|---|---|---|
| 7 | 0 | 2,4-dimethylphenyl | 2,4-dimethylphenyl | — | — | biphenyl-4,4'-diyl-X | —CH$_2$COO(CH$_2$)$_3$—<br>—SiMe$_2$(OMe) |
| 8 | 0 | 4-methylphenyl | 4-methylphenyl | — | — | 1,3-phenylene-X | —COO(CH$_2$)$_3$—<br>—SiMe(OMe)$_2$ |
| 9 | 0 | 4-methylphenyl | 4-methylphenyl | — | — | 1,3-phenylene-X | —COOCH$_2$C$_6$H$_4$—<br>—SiMe$_2$(OMe) |
| 10 | 0 | 4-methylphenyl | 4-methylphenyl | — | — | 1,3-phenylene-X | —CH$_2$COO—<br>—CH$_2$C$_6$H$_4$(CH$_2$)$_2$—<br>—SiMe(OMe)$_2$ |
| 11 | 0 | 4-methylphenyl | 4-methylphenyl | — | — | 1,3-phenylene-X | —(CH$_2$)$_2$COO—<br>—(CH$_2$)$_3$SiMe(OMe)$_2$ |
| 12 | 0 | 4-methylphenyl | 4-methylphenyl | — | — | 1,3-phenylene-X | —(CH$_2$)$_2$COOCH$_2$—<br>—C$_6$H$_4$SiMe$_2$(OMe) |

TABLE 3

| compound | k | Ar¹ | Ar² | Ar³ | Ar⁴ | Ar⁵ | X |
|---|---|---|---|---|---|---|---|
| 13 | 0 | 3,4-dimethylphenyl | biphenyl | — | — | phenyl-X | —CH=CHSiMe(OEt)$_2$ |
| 14 | 0 | 3,4-dimethylphenyl | biphenyl | — | — | phenyl-X | —CH=CHCH$_2$—SiMe$_2$(OEt) |
| 15 | 0 | 3,4-dimethylphenyl | biphenyl | — | — | phenyl-X | —CH=CH(CH$_2$)$_2$—SiMe(OMe)$_2$ |
| 16 | 0 | 3,4-dimethylphenyl | biphenyl | — | — | phenyl-X | —CH=CH(CH$_2$)$_2$—SiMe$_2$(OMe) |
| 17 | 0 | 3,4-dimethylphenyl | biphenyl | — | — | phenyl-X | —CH=CHC$_6$H$_4$—SiMe(OMe)$_2$ |
| 18 | 0 | 3,4-dimethylphenyl | biphenyl | — | — | phenyl-X | —CH=CHC$_6$H$_4$—(CH$_2$)$_2$SiMe$_2$(OMe) |

TABLE 4

| compound | k | Ar¹ | Ar² | Ar³ | Ar⁴ | Ar⁵ | X |
|---|---|---|---|---|---|---|---|
| 19 | 0 | 3,4-dimethylphenyl | biphenyl | — | — | phenyl-X | —(CH$_2$)$_2$SiMe(OEt)$_2$ |
| 20 | 0 | 3,4-dimethylphenyl | biphenyl | — | — | phenyl-X | —(CH$_2$)$_3$SiMe$_2$(OEt) |
| 21 | 0 | 3,4-dimethylphenyl | biphenyl | — | — | phenyl-X | —(CH$_2$)$_4$SiPh(OMe)$_2$ |
| 22 | 0 | 3,4-dimethylphenyl | biphenyl | — | — | phenyl-X | —(CH$_2$)$_2$SiMe$_2$(OiPr) |
| 23 | 1 | 3,4-dimethylphenyl | phenyl | phenyl-X | 3,4-dimethylphenyl | 3,3'-dimethylbiphenyl | —CH=N(CH$_2$)$_3$—SiMe$_2$(OMe) |

TABLE 4-continued

| compound | k | Ar¹ | Ar² | Ar³ | Ar⁴ | Ar⁵ | X |
|---|---|---|---|---|---|---|---|
| 24 | 1 | 3,4-dimethylphenyl | phenyl | –C₆H₄–X | 3,4-dimethylphenyl | biphenyl-4,4'-diyl | —O(CH₂)₃—<br>—SiMe(OMe)₂ |

TABLE 5

| compound | k | Ar¹ | Ar² | Ar³ | Ar⁴ | Ar⁵ | X |
|---|---|---|---|---|---|---|---|
| 25 | 1 | 2,6-dimethyl-4-methoxyphenyl | phenyl | –C₆H₄–X | 2,6-dimethyl-4-methoxyphenyl | 2,2',6,6'-tetramethylbiphenyl-4,4'-diyl (with CH₃ groups) | —O(CH₂)₃—<br>—SiMe₂(OMe) |
| 26 | 1 | 2,6-dimethyl-4-methoxyphenyl | phenyl | –C₆H₄–X | 2,6-dimethyl-4-methoxyphenyl | biphenyl-4,4'-diyl | —CH₂O(CH₂)₃—<br>—SiMe(OMe)₂ |
| 27 | 1 | 4-methylphenyl | phenyl | –C₆H₄–X | 4-methylphenyl | 3,3'-dimethylbiphenyl-4,4'-diyl | —COO(CH₂)₃—<br>—SiMe(OMe)₂ |
| 28 | 1 | 3,4-dimethylphenyl | phenyl | –C₆H₄–X | 3,4-dimethylphenyl | 3,3'-dimethylbiphenyl-4,4'-diyl | —CH₂COO(CH₂)₃—<br>—SiMe₂(OMe) |
| 29 | 1 | 3,4-dimethylphenyl | phenyl | –C₆H₄–X | 3,4-dimethylphenyl | 3,3'-dimethylbiphenyl-4,4'-diyl | —COO(CH₂)₃—<br>—SiMe(OMe)₂ |
| 30 | 1 | 3,4-dimethylphenyl | phenyl | –C₆H₄–X | 3,4-dimethylphenyl | 3,3'-dimethylbiphenyl-4,4'-diyl | —COOCH₂C₆H₄—<br>—SiMe₂(OMe) |

TABLE 6

| compound | k | Ar¹ | Ar² | Ar³ | Ar⁴ | Ar⁵ | X |
|---|---|---|---|---|---|---|---|
| 31 | 1 | 3,4-dimethylphenyl | phenyl | –C₆H₄–X | 3,4-dimethylphenyl | 3,3'-dimethylbiphenyl-4,4'-diyl | —CH₂COO—<br>—CH₂C₆H₄(CH₂)₂—<br>—SiMe(OMe)₂ |
| 32 | 1 | 3,4-dimethylphenyl | phenyl | –C₆H₄–X | 3,4-dimethylphenyl | 3,3'-dimethylbiphenyl-4,4'-diyl | —(CH₂)₂COO—<br>—(CH₂)₃SiMe(OMe)₂ |
| 33 | 1 | 3,4-dimethylphenyl | phenyl | –C₆H₄–X | 3,4-dimethylphenyl | 3,3'-dimethylbiphenyl-4,4'-diyl | —(CH₂)₂COOCH₂—<br>—C₆H₄SiMe₂(OMe) |

TABLE 6-continued

| compound | k | Ar¹ | Ar² | Ar³ | Ar⁴ | Ar⁵ | X |
|---|---|---|---|---|---|---|---|
| 34 | 1 | 2,4-diMe-phenyl | phenyl | phenyl-X (para) | 2,4-diMe-phenyl | 2,2'-diMe-biphenyl | —CH=CHSiMe(OEt)$_2$ |
| 35 | 1 | 2,4-diMe-phenyl | phenyl | phenyl-X (para) | 2,4-diMe-phenyl | biphenyl | —CH=CHCH$_2$—<br>—SiMe$_2$(OEt) |
| 36 | 1 | 2,6-diMe-4-(OCH$_3$)-phenyl | phenyl | phenyl-X (para) | 2,6-diMe-4-(OCH$_3$)-phenyl | 2,2'-diMe-biphenyl | —CH=CH(CH$_2$)$_2$—<br>—SiMe(OMe)$_2$ |

TABLE 7

| compound | k | Ar¹ | Ar² | Ar³ | Ar⁴ | Ar⁵ | X |
|---|---|---|---|---|---|---|---|
| 37 | 1 | 2,6-diMe-4-(OCH$_3$)-phenyl | phenyl | phenyl-X (para) | 2,6-diMe-4-(OCH$_3$)-phenyl | biphenyl | —CH=CH(CH$_2$)$_2$—<br>—SiMe$_2$(OMe) |
| 38 | 1 | 2,4-diMe-phenyl | phenyl | phenyl-X (para) | 2,4-diMe-phenyl | 2,2'-diMe-biphenyl | —CH=CHC$_6$H$_4$—<br>—SiMe(OMe)2 |
| 39 | 1 | 2,4-diMe-phenyl | phenyl | phenyl-X (para) | 2,4-diMe-phenyl | biphenyl | —CH=CHC$_6$H$_4$—<br>—(CH$_2$)$_2$SiMe$_2$(OMe) |
| 40 | 1 | 2,6-diMe-4-(OCH$_3$)-phenyl | phenyl | phenyl-X (para) | 2,6-diMe-4-(OCH$_3$)-phenyl | 2,2'-diMe-biphenyl | —(CH$_2$)$_2$SiMe(OEt)$_2$ |
| 41 | 1 | 2,6-diMe-4-(OCH$_3$)-phenyl | phenyl | phenyl-X (para) | 2,6-diMe-4-(OCH$_3$)-phenyl | biphenyl | —(CH$_2$)$_3$SiMe$_2$(OEt) |
| 42 | 1 | 4-Me-phenyl | phenyl | phenyl-X (para) | 4-Me-phenyl | 2,2'-diMe-biphenyl | —(CH$_2$)$_4$SiPh(OMe)$_2$ |

TABLE 8
| compound | k | Ar¹ | Ar² | Ar³ | Ar⁴ | Ar⁵ | X |
|---|---|---|---|---|---|---|---|
| 43 | 0 | 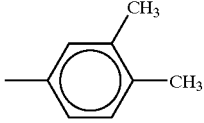 |  | — | — | 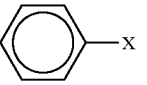 | —CH=NCH₂—<br>—Si(OMe)₂Me |
| 44 | 0 | 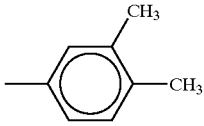 |  | — | — | 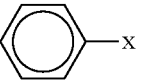 | —CH=N(CH₂)₃—<br>—SiMe₂(OMe) |
| 45 | 0 | 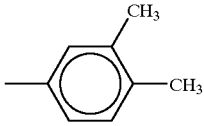 |  | — | — | 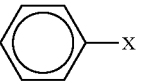 | —O(CH₂)₃—<br>—SiMe(OMe)₂ |
| 46 | 0 | 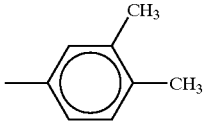 |  | — | — | 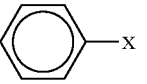 | —O(CH₂)₃—<br>—SiMe₂(OMe) |
| 47 | 0 | 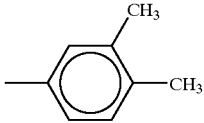 |  | — | — | 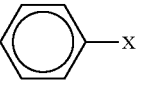 | —CH₂O(CH₂)₃—<br>—SiMe(OMe)₂ |
| 48 | 0 | 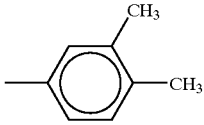 |  | — | — | 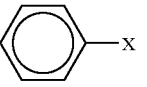 | —COO(CH₂)₃—<br>—SiMe(OMe)₂ |
TABLE 9
| compound | k | Ar¹ | Ar² | Ar³ | Ar⁴ | Ar⁵ | X |
|---|---|---|---|---|---|---|---|
| 49 | 0 | 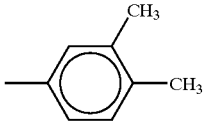 |  | — | — | 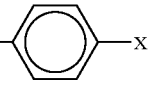 | —CH₂COO(CH₂)₃—<br>—SiMe₂(OMe) |
| 50 | 0 | 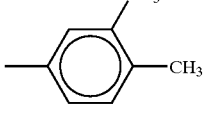 |  | — | — | 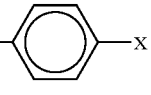 | —COO(CH₂)₃—<br>—SiMe(OMe)₂ |
| 51 | 0 | 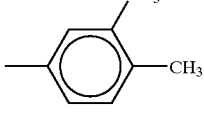 |  | — | — | 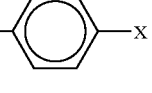 | —COOCH₂C₆H₄—<br>—SiMe₂(OMe) |
| 52 | 0 | 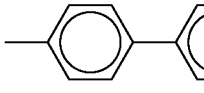 |  | — | — | 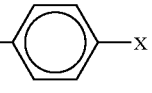 | —CH₂COO—<br>—CH₂C₆H₄(CH₂)₂—<br>—SiMe(OMe)₂ |

TABLE 9-continued

| compound | k | Ar¹ | Ar² | Ar³ | Ar⁴ | Ar⁵ | X |
|---|---|---|---|---|---|---|---|
| 53 | 0 | 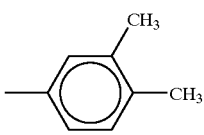 | 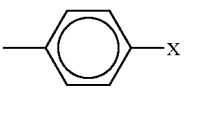 | — | — | 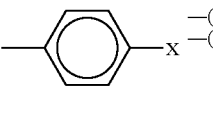 | —(CH$_2$)$_2$COO—<br>—(CH$_2$)$_3$SiMe(OMe)$_2$ |
| 54 | 0 | 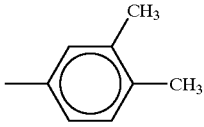 | 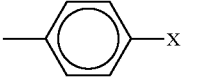 | — | — | 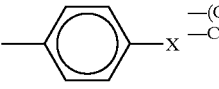 | —(CH$_2$)$_2$COOCH$_2$—<br>—C$_6$H$_4$SiMe$_2$(OMe) |

TABLE 10

| compound | k | Ar¹ | Ar² | Ar³ | Ar⁴ | Ar⁵ | X |
|---|---|---|---|---|---|---|---|
| 55 | 0 | 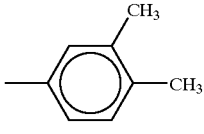 | 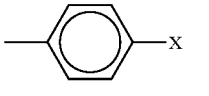 | — | — | 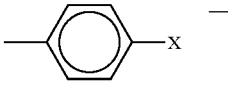 | —CH=CHSiMe(OEt)$_2$ |
| 56 | 0 | 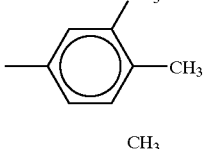 | 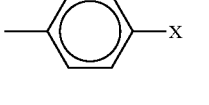 | — | — | 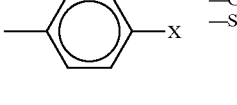 | —CH=CHCH$_2$—<br>—SiMe$_2$(OEt) |
| 57 | 0 | 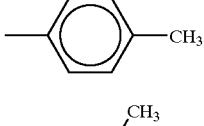 |  | — | — |  | —CH=CH(CH$_2$)$_2$—<br>—SiMe(OMe)$_2$ |
| 58 | 0 | 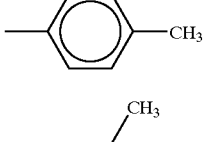 |  | — | — |  | —CH=CH(CH$_2$)$_2$—<br>—SiMe$_2$(OMe) |
| 59 | 0 | 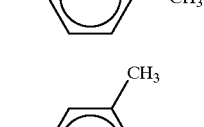 |  | — | — |  | —CH=CHC$_6$H$_4$—<br>—SiMe(OMe)$_2$ |
| 60 | 0 | 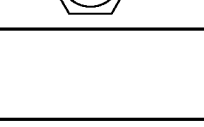 | 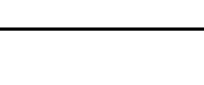 | — | — | 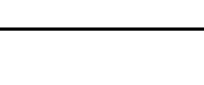 | —CH=CHC$_6$H$_4$—<br>—(CH$_2$)$_2$SiMe$_2$(OMe) |

TABLE 11

| compound | k | Ar¹ | Ar² | Ar³ | Ar⁴ | Ar⁵ | X |
|---|---|---|---|---|---|---|---|
| 61 | 0 | 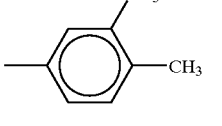 | 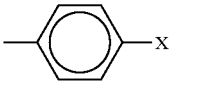 | — | — | 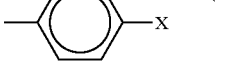 | —(CH$_2$)$_2$SiMe(OEt)$_2$ |

TABLE 11-continued

| compound | k | Ar¹ | Ar² | Ar³ | Ar⁴ | Ar⁵ | X |
|---|---|---|---|---|---|---|---|
| 62 | 0 | biphenyl | phenyl-X | — | — | phenyl-X | —(CH$_2$)$_3$SiMe$_2$(OEt) |
| 63 | 0 | 2,4-dimethylphenyl | phenyl-X | — | — | phenyl-X | —(CH$_2$)$_4$SiPh(OMe)$_2$ |
| 64 | 0 | 2,4-dimethylphenyl | phenyl-X | — | — | phenyl-X | —CH=NCH$_2$—<br>—Si(OMe)$_2$Me |
| 65 | 0 | biphenyl | phenyl-X | — | — | phenyl-X | —(CH$_2$)$_2$COO—<br>—(CH$_2$)$_3$SiMe(OMe)$_2$ |
| 66 | 0 | biphenyl | phenyl-X | — | — | phenyl-X | —(CH$_2$)$_2$COOCH$_2$—<br>—C$_6$H$_4$SiMe$_2$(OMe) |

TABLE 12

| compound | k | Ar¹ | Ar² | Ar³ | Ar⁴ | Ar⁵ | X |
|---|---|---|---|---|---|---|---|
| 67 | 0 | biphenyl | phenyl-X | — | — | phenyl-X | —(CH$_2$)$_2$COO—<br>—(CH$_2$)$_3$SiMe$_2$(OMe) |
| 68 | 0 | 2,4-dimethylphenyl | biphenyl-X | — | — | biphenyl-X | —COO(CH$_2$)$_3$—<br>—SiMe(OMe)$_2$ |
| 69 | 0 | 2,4-dimethylphenyl | biphenyl-X | — | — | biphenyl-X | —COOCH$_2$C$_6$H$_4$—<br>—(CH$_2$)$_2$SiMe(OMe)$_2$ |
| 70 | 0 | 4-methoxyphenyl | phenyl-X | — | — | phenyl-X | —CH$_2$COO—<br>—CH$_2$C$_6$H$_4$(CH$_2$)$_2$—<br>—SiMe(OMe)$_2$ |
| 71 | 1 | 2,4-dimethylphenyl | phenyl-X | phenyl-X | 2,4-dimethylphenyl | 2,2'-dimethylbiphenyl | —(CH$_2$)$_2$COO—<br>—(CH$_2$)$_3$SiMe(OMe)$_2$ |
| 72 | 1 | 2,4-dimethylphenyl | phenyl-X | phenyl-X | 2,4-dimethylphenyl | 2,2'-dimethylbiphenyl | —(CH$_2$)$_2$COOCH$_2$—<br>—C$_6$H$_4$SiMe$_2$(OMe) |

TABLE 13

| compound | k | Ar¹ | Ar² | Ar³ | Ar⁴ | Ar⁵ | X |
|---|---|---|---|---|---|---|---|
| 73 | 1 | 2,4-dimethylphenyl | phenylene-X | phenylene-X | 3,4-dimethylphenyl | 2,2'-dimethylbiphenyl | —(CH$_2$)$_2$COO—<br>—(CH$_2$)$_3$SiMe$_2$(OMe) |
| 74 | 1 | 2,4-dimethylphenyl | phenylene-X | phenylene-X | 3,4-dimethylphenyl | 2,2'-dimethylbiphenyl | —CH=CH(CH$_2$)$_2$—<br>—SiMe(OMe)$_2$ |
| 75 | 1 | 2,4-dimethylphenyl | phenylene-X | phenylene-X | 3,4-dimethylphenyl | 2,2'-dimethylbiphenyl | —(CH$_2$)$_2$SiMe(OEt)$_2$ |
| 76 | 1 | 2,4-dimethylphenyl | phenylene-X | phenylene-X | 3,4-dimethylphenyl | 2,2'-dimethylbiphenyl | —O(CH$_2$)$_3$—<br>—SiMe(OMe)$_2$ |
| 77 | 1 | 2,4-dimethylphenyl | phenylene-X | phenylene-X | 3,4-dimethylphenyl | biphenyl | —(CH$_2$)$_2$COO—<br>—(CH$_2$)$_3$SiMe$_2$(OMe) |
| 78 | 1 | 2,4-dimethylphenyl | phenylene-X | phenylene-X | 3,4-dimethylphenyl | biphenyl | —(CH$_2$)$_2$COOCH$_2$—<br>—C$_6$H$_4$SiMe$_2$(OMe) |

TABLE 14

| compound | k | Ar¹ | Ar² | Ar³ | Ar⁴ | Ar⁵ | X |
|---|---|---|---|---|---|---|---|
| 79 | 1 | 3,4-dimethylphenyl | phenylene-X | phenylene-X | 3,4-dimethylphenyl | biphenyl | —(CH$_2$)$_2$COO—<br>—(CH$_2$)$_3$SiMe$_2$(OMe) |
| 80 | 1 | 3,4-dimethylphenyl | phenylene-X | phenylene-X | 3,4-dimethylphenyl | biphenyl | —CH=CH(CH$_2$)$_2$—<br>—SiMe(OMe)$_2$ |
| 81 | 1 | 3,4-dimethylphenyl | phenylene-X | phenylene-X | 3,4-dimethylphenyl | biphenyl | —(CH$_2$)$_2$SiMe(OEt)$_2$ |
| 82 | 1 | 3,4-dimethylphenyl | phenylene-X | phenylene-X | 3,4-dimethylphenyl | biphenyl | —O(CH$_2$)$_3$—<br>—SiMe(OMe)$_2$ |
| 83 | 1 | 3,4-dimethylphenyl | phenylene-X | phenylene-X | 3,4-dimethylphenyl | terphenyl | —(CH$_2$)$_2$COO—<br>—(CH$_2$)$_3$SiMe(OMe)$_2$ |
| 84 | 1 | 3,4-dimethylphenyl | phenylene-X | phenylene-X | 3,4-dimethylphenyl | terphenyl | —(CH$_2$)$_2$COOCH$_2$—<br>—C$_6$H$_4$SiMe$_2$(OMe) |

TABLE 15

| compound | k | Ar¹ | Ar² | Ar³ | Ar⁴ | Ar⁵ | X |
|---|---|---|---|---|---|---|---|
| 85 | 1 | 3,4-dimethylphenyl | phenylene-X | phenylene-X | 3,4-dimethylphenyl | terphenyl | —$(CH_2)_2COO$—<br>—$(CH_2)_3SiMe_2(OMe)$ |
| 86 | 0 | 3,4-dimethylphenyl | phenylene-X | phenylene-X | 3,4-dimethylphenyl | terphenyl | —$CH=CH(CH_2)_2$—<br>—$SiMe(OMe)_2$ |
| 87 | 1 | 3,4-dimethylphenyl | phenylene-X | phenylene-X | 3,4-dimethylphenyl | terphenyl | —$(CH_2)_2SiMe(OEt)_2$ |
| 88 | 1 | 3,4-dimethylphenyl | phenylene-X | phenylene-X | 3,4-dimethylphenyl | terphenyl | —$O(CH_2)_3$—<br>—$SiMe(OMe)_2$ |
| 89 | 1 | phenyl | phenylene-X | phenylene-X | phenyl | 3,3'-dimethylbiphenyl | —$(CH_2)_2COO$—<br>—$(CH_2)_3SiMe(OMe)_2$ |
| 90 | 1 | phenyl | phenylene-X | phenylene-X | phenyl | 3,3'-dimethylbiphenyl | —$(CH_2)_2COOCH_2$—<br>—$C_6H_4SiMe_2(OMe)$ |

TABLE 16

| compound | k | Ar¹ | Ar² | Ar³ | Ar⁴ | Ar⁵ | X |
|---|---|---|---|---|---|---|---|
| 91 | 1 | phenyl | phenylene-X | phenylene-X | phenyl | biphenyl | —$(CH_2)_2COO$—<br>—$(CH_2)_3SiMe_2(OMe)$ |
| 92 | 1 | phenyl | phenylene-X | phenylene-X | phenyl | biphenyl | —$CH=CH(CH_2)_2$—<br>—$SiMe(OMe)_2$ |
| 93 | 1 | phenyl | phenylene-X | phenylene-X | phenyl | terphenyl | —$(CH_2)_2SiMe(OEt)_2$ |
| 94 | 1 | phenyl | phenylene-X | phenylene-X | phenyl | terphenyl | —$O(CH_2)_3$—<br>—$SiMe(OMe)_2$ |
| 95 | 0 | phenylene-X | phenylene-X | — | — | phenylene-X | —$(CH_2)_2COO$—<br>—$(CH_2)_3SiMe(OMe)_2$ |
| 96 | 0 | phenylene-X | phenylene-X | — | — | phenylene-X | —$(CH_2)_2COOCH_2$—<br>—$C_6H_4SiMe_2(OMe)$ |

TABLE 17

| compound | k | Ar¹ | Ar² | Ar³ | Ar⁴ | Ar⁵ | X |
|---|---|---|---|---|---|---|---|
| 97 | 0 | –C₆H₄–X | –C₆H₄–X | — | — | –C₆H₄–X | —(CH₂)₂COO—<br>—(CH₂)₃SiMe₂(OMe) |
| 98 | 0 | –C₆H₄–X | –C₆H₄–X | — | — | 2,6-dimethylphenyl-X | —CH=CH(CH₂)₂—<br>—SiMe(OMe)₂ |
| 99 | 0 | –C₆H₄–X | –C₆H₄–X | — | — | –C₆H₄–X | —(CH₂)₂SiMe(OEt)₂ |
| 100 | 0 | –C₆H₄–X | –C₆H₄–X | — | — | –C₆H₄–X | —O(CH₂)₃—<br>—SiMe(OMe)₂ |
| 101 | 1 | –C₆H₄–X | –C₆H₄–X | –C₆H₄–X | –C₆H₄–X | 3,3'-dimethylbiphenyl-X | —(CH₂)₂COO—<br>—(CH₂)₃SiMe(OMe)₂ |
| 102 | 1 | –C₆H₄–X | –C₆H₄–X | –C₆H₄–X | –C₆H₄–X | 3,3'-dimethylbiphenyl-X | —(CH₂)₂SiMe(OEt)₂ |

In addition, although the aforementioned compounds are used mainly as a material for a hole injecting layer or a hole transporting layer, exemplified compounds 83, 87 and the like are used also as a material for a light-emitting layer.

On the other hand, among the compounds represented by the general formula (I), examples of compounds which can be used as a material for a light-emitting layer or a material for an electron transporting layer, are summarized in Table 18.

Among them, exemplified compound 103, 104, 107 and 109 are a material which can be used as a material for a light-emitting layer. In addition, exemplified compounds 105, 106, 111 and 112 are a material which can be used as a material for an electron transporting layer. Further, exemplified compounds 108, 110 and 113 can be used as a material for a light-emitting layer, a material for an electron injecting and light-emitting material and a material for an electron transporting layer.

TABLE 18

| compound | structural formula |
|---|---|

103

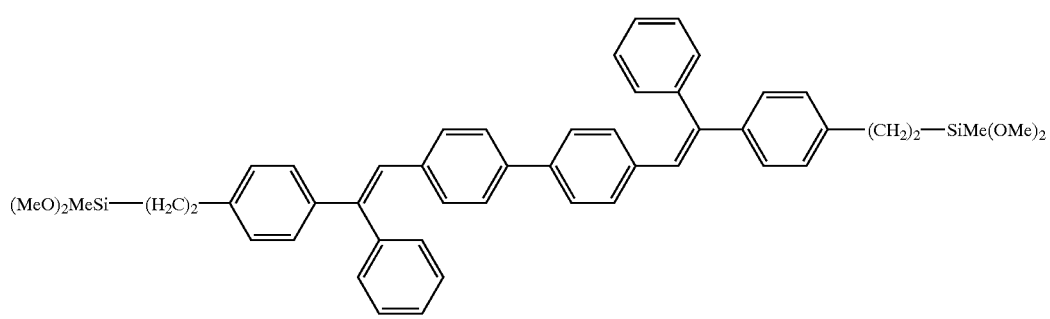

TABLE 18-continued
| compound structural formula |
| --- |
104
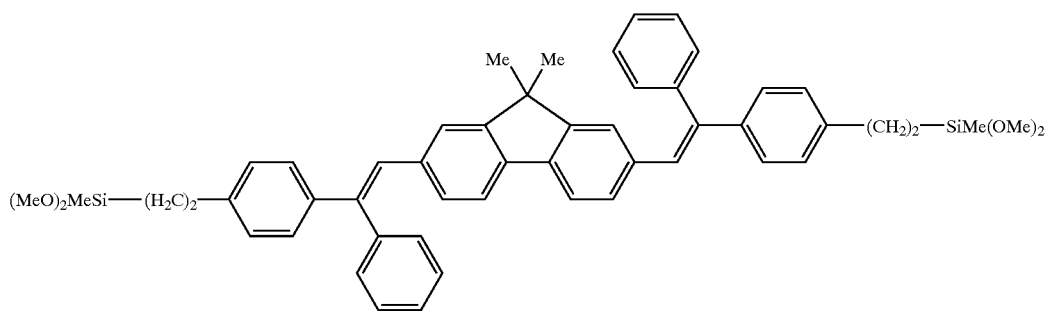
105
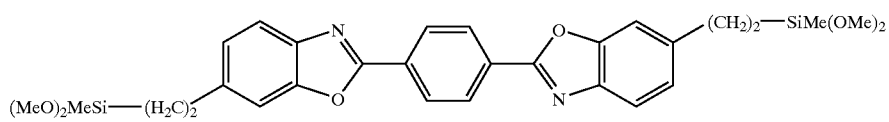
106
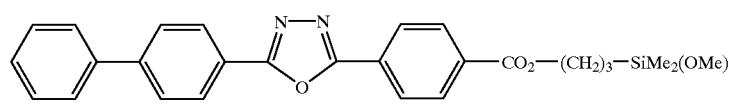
107
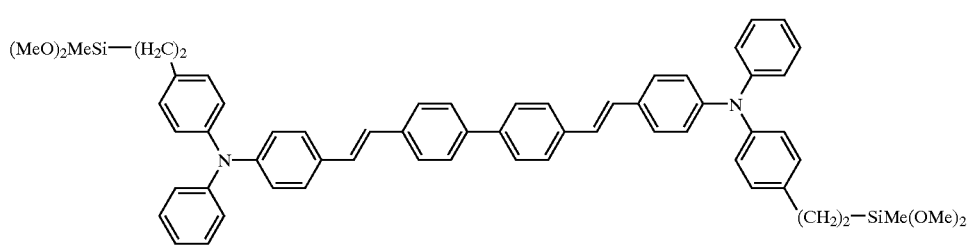
108
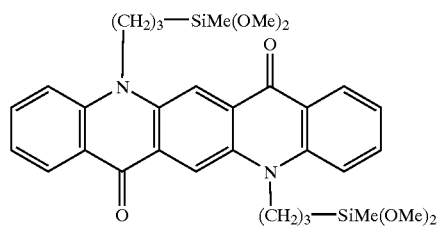
109
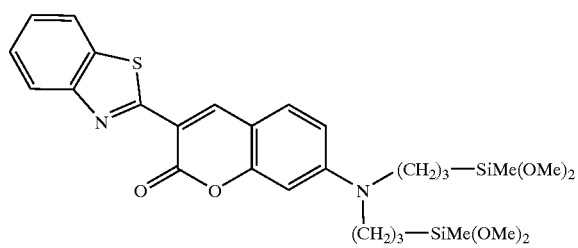
110
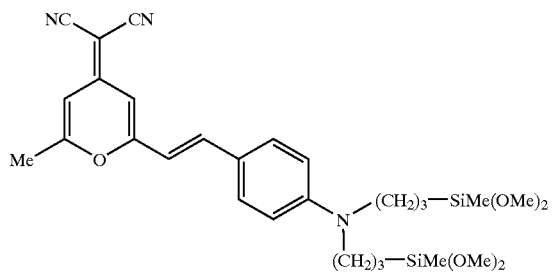

TABLE 18-continued compound structural formula

111
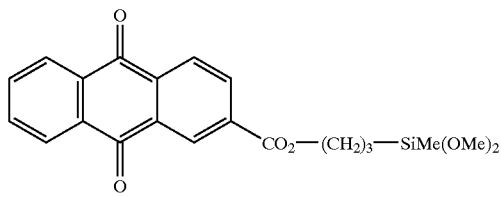

112
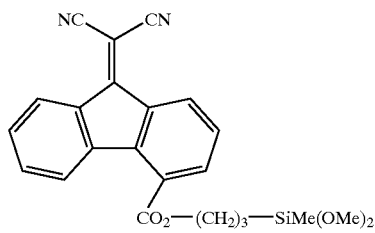

113
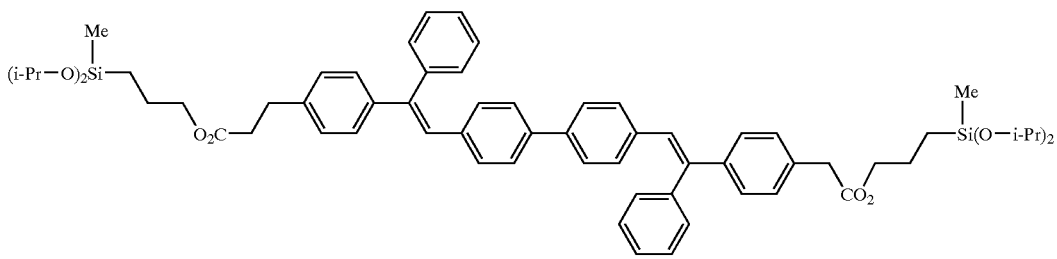

In the organic EL device in the invention, at least one layer of organic film layers comprises a cross-linked cured film comprising a compound having a substituted silicon group having a hydrolyzable group or a derivative thereof, and all the layers may be the cross-linked cured film.

On the other hand, when not all the layers comprise the cross-linked cured film, it is preferable that the layer consisting of the cross-linked cured film is provided at least as a layer under a layer formed by solution coating. For example, in FIG. 1, a hole injecting layer 3 or the like is preferably a layer consisting of the cross-linked cured film, when a light-emitting layer 5 is formed by solution coating. In particular, when a layer under the cross-linked cured film is formed by deposition, there is an advantage that the irregularities of the surface of the deposited layer are smoothened by forming the cross-linked cured film on the surface of the deposited layer and that, even when a solution coating film is formed on the surface of the cross-linked cured film, the smoothness is also maintained on the coating layer.

In addition, when the number of the organic film layer is plural, it is preferable that two or more layers containing the aforementioned cross-linked cured film are included. One example is a hole injecting layer 3 and a hole transporting layer 4 in FIG. 2. In this case, when all the layers are formed by solution coating, and in particular, when only a hole injecting layer 3 is a layer consisting of the cross-linked cured film, not only it becomes difficult to form a light-emitting layer 5 on the surface of a hole transporting layer 4 by coating, but also, even when a light-emitting layer can be formed, an interface between a hole transporting layer 4 and a light-emitting layer 5 becomes indefinite and thus the sufficient luminance and durability as the EL device can not be obtained in some cases.

Therefore, it is preferable that the relevant two layers in the case where the aforementioned two or more layers consist of a cross-linked cured film containing a compound having a substituted silicon group, are two layers counted from a substrate side when layers are successively formed on the surface of a substrate.

The compound represented by the general formula (I) of the present invention alone can form a hole injecting layer, a light-emitting layer and the like. However, the aforementioned known materials for the hole injecting and transporting layers or light-emitting and electron transporting layers can be used by mixing (doping) them for the purpose of enhancing the carrier injecting and transporting efficiency, the light-emission efficiency and the like.

In this case, a mass ratio (A:B) of a mass A of the aforementioned known material for the hole injecting and transporting layers or light-emitting and electron transporting layers and a mass B of the compound represented by the general formula (I) is preferably 90:10 to 0:100, more preferably 70:30 to 0:100 in the hole injecting and transporting layers. In the light-emitting and electron transporting layers, 95:5 to 0:100 is preferable, and 70:30 to 0:100 is more preferable.

Other resins can be mixed as a binding resin for each layer when they can be cured with the compound represented by the general formula (I). Resins to be used are not particularly limited, but examples thereof include a polycarbonate resin, a polyester resin, an acrylic resin, a polyvinyl chloride resin, a polystyrene resin, a phenol resin, a silicone resin and the like.

Further, for the purpose of adjusting the film forming property and the flexibility, the compound represented by the general formula (I) may be used by mixing with other coupling agent, fluorine compound and the like. As such the compound, various silane coupling agents, and commercially available silicone-based hard coating agents can be used.

As the aforementioned silane coupling agent, vinyltrichlorosilane, vinyltrimethoxysilane, vinyltriethoxysilane, γ-glycidoxypropylmethyldiethoxysilane, γ-glycidoxypropyltrimethoxysilane, γ-glycidoxypropyltriethoxysilane, γ-aminopropyltriethoxysilane, γ-aminopropyltrimethoxysilane, γ-aminopropylmethyldimethoxysilane, N-β(aminoethyl)-γ-aminopropyltriethoxysilane, tetramethoxysilane, methyltrimethoxysilane, dimethyldimethoxysilane and the like can be used. As the commercially available silicone-based hard coating agent, KP-85, X-40-9740, X-40-2239 (foregoing are manufactured by Shin-Etsu Silicone Co., Ltd.), and AY42-440, AY42-441, AY49-208 (foregoing are manufactured by Dow Corning Toray Silicone Co., Ltd.), and the like can be used. In addition, in order to impart the water repellency, fluorine-containing compounds such as (tridecafluoro-1,1,2,2-tetrahydrooctyl)triethoxysilane, (3,3,3-trifluoropropyl)trimethoxysilane, 3-(heptafluoroisopropoxy)propyltriethoxysilane, 1H,1H,2H,2H-perfluoroalkyltriethoxysilane, 1H,1H,2H,2H-perfluorodecyltriethoxysilane, 1H,1H,2H,2H-perfluorooctyltriethoxysilane and the like may be added.

The silane coupling agent can be used at an arbitrary amount, and an amount of the fluorine-containing compound is desirably 10% by mass or smaller relative to a compound containing no fluorine. When the amount of the fluorine-containing compound exceeds this, a problem arises on the film forming property of the cross-linked cured film in some cases.

Besides, if needed, organic titanium compounds such as a titanium chelate compound, a titanate coupling agent and the like; organic aluminum compounds such as an aluminum chelate compound, an aluminum coupling agent and the like; organic metal compounds such as an antimony alkoxide compound, an aluminum titanium alkoxide compound and the like, can be used.

Preparation of these coating solutions may be performed without a solvent or, if necessary, alcohols such as methanol, ethanol, propanol, butanol and the like; ketones such as acetone, methyl ethyl ketone and the like; ethers such as tetrahydrofuran, diethyl ether, dioxane and the like; and the like may be used as a solvent. Preferable solvents have a boiling point of 100° C. or lower, and solvents may be used by arbitrarily mixing. An amount of the solvent may be set arbitrarily. However, since the compound represented by the general formula (I) is easily deposited when an amount of the solvent is too small, the solvent is used at an amount of 0.5 to 30 parts by mass, preferably 1 to 20 parts by mass relative to 1 part by mass of the compound represented by the general formula (I).

In preparation of the coating solution, for the purpose of hydrolyzing —Si$(R_1)_{(3-a)}Q_a$ into Si$(R_1)_{(3-a)}(OH)_a$ in advance, the compound of the general formula (I) and, if needed, other compounds are reacted by contacting with a solid catalyst. A reaction temperature and a reaction time are different depending on a kind of a raw material. A reaction is usually performed at 0 to 100° C., more preferably 10 to 70° C., particularly preferably 15 to 50° C. A reaction time is not particularly limited, and since when a reaction time becomes longer, a gel is easily produced, a reaction is preferably performed in a range of 10 minutes to 100 hours.

When a polymer having a group which can bind to the compound represented by the general formula (I) is added, since a solid catalyst and the polymer being present at the same time remarkably promotes gelation, making the coating operation difficult to perform, it is preferable that the polymer is added after the solid catalyst is removed. Such the solid catalyst is not particularly limited as far as catalyst components are not soluble in any of a solution of the compound of the general formula (I), other compounds, solvents and the like. Hydrolysis can be performed in advance by using the following catalysts as the solid catalyst which is not soluble in the system.

Cationic exchange resin: Amberlite 15, Amberlite 200C, Amberlist 15 (foregoing are manufactured by Rohm and Haas Co.); Dowex MWC-1-H, Dowex 88, Dowex HCR-W2 (foregoing are manufactured by Dow Chemical Company); Revachit SPC-108, Revachit SPC-118 (foregoing are manufactured by Bayer); Diaion RCP-150H (manufactured by Mitsubishi Chemical Industries); Sumikaion KC-470, Duolite C26-C, Duolite C-433, Duolite-464 (foregoing are manufactured by Sumitomo Chemical Co., Ltd.); Nafion-H (manufactured by Du Pont K.K.) etc.

Anionic exchange resin: Amberlite IRA-400, Amberlite IRA-45 (foregoing are manufactured by Rohm and Haas Co.) etc.

Inorganic solid in which a group containing a protonic acid group is bound to the surface: Zr$(O_3PCH_2CH_2SO_3H)_2$, Th$(O_3PCH_2CH_2COOH)_2$ etc.

Polyorganosiloxane containing a protonic acid group: polyorganosiloxane having a sulfonic acid group etc.

Heteropolyacid: Cobalttungstic acid, phosphomolybdic acid etc.

Isopolyacid: niobic acid, tantalic acid, molybdic acid etc.

Mono-type metal oxide: silica gel, alumina, chromia, zirconia, CaO, MgO etc.

Composite metal oxide: silica-alumina, silica-magnesia, silica-zirconia, zeolite etc.

Clay mineral: acid clay, activated clay, montmorillonite, kaolinite etc.

Metal sulfate: LiSO$_4$, MgSO$_4$ etc.

Metal phosphate: zirconium phosphate, lanthanide phosphate etc.

Metal nitrate: LiNO$_3$, Mn(NO$_3$)$_2$ etc.

Inorganic solid in which a group containing an amino group is bound to the surface: solid obtained by reacting aminopropyltriethoxysilane on silica gel; etc.

Polyorganosiloxane containing an amino group: amino-modified silicone resin etc.

Among these catalysts, at least one kind of the catalyst is used to perform a hydrolysis condensation reaction. A reaction may be performed by a flowing format by disposing these catalysts in a fixed bed, or may be performed by a batch format. An amount of the catalyst to be used is not particularly limited, but it is preferable that the amount is 0.1 to 20% by mass relative to a total amount of compounds having a substituted silicon group having a hydrolysable group.

An amount of water to be added upon hydrolysis condensation is not particularly limited, but since the amount influences on the storage stability of the product and inhibition of gelation upon supply to polymerization, it is preferable that the amount of water is in a range of 30 to 500%, further 50 to 300% relative to a theoretical amount necessary for completely hydrolyzing all the hydrolysable groups of the compound represented by the general formula (I). When the amount of added water is more than 500% of the theoretically necessary amount, the storage stability of the product is deteriorated and precipitation is easily caused. On the other hand, when the amount of added water is less than 30% of the theoretically necessary amount, unreacted compounds are increased, easily causing phase separation at coating of a coating solution and curing, as well as reduction in the strength of a coating film.

Upon curing, a curing catalyst may be optionally added. Examples of the curing catalyst include protonic acids such as hydrochloric acid, acetic acid, phosphoric acid and sulfuric acid; bases such as ammonia, triethylamine and the like; organic tins compounds such as dibutyltin diacetate, dibutyltin dioctoate, stannous octoate and the like: organic titanium compounds such as tetra-n-butyl titanate, tetraisopropyl titanate and the like: organic aluminum compounds such as aluminum tributoxide, aluminum triacetylacetonate an the like: ion salt, manganese salt, cobalt salt, zinc salt, zirconium salt and the like of organic carboxylic acids. From a viewpoint of the storage stability, metal compounds are preferable, and metal acetylacetonate or acetylacetate is further preferable.

An amount of the curing catalyst to be used can be arbitrarily set, but from a viewpoint of the storage stability, the properties and the strength, the amount is preferably 0.1 to 20% by mass, more preferably 0.3 to 10% by mass relative to a total amount of the compounds having a substituted silicon group having a hydrolysable group.

A curing temperature can be arbitrarily set, but in order to obtain the desired strength, the temperature is set at 60° C. or higher, more preferably 80° C. or higher. A curing time can be arbitrarily set, if necessary, but the time is preferably 10 minutes to 5 hours. In addition, it is also effective to maintain the high humidity state after a curing reaction, and try to stabilize the properties. Further, depending on use, hexamethyldisilazane and trimethylchlorosilane are used to perform the surface treatment for hydrophobilization.
-Cathode- As a material as a cathode 7, it is possible to use the aforementioned material used for an anode 2. However, in order to effectively inject electrons, a metal having a low work function is preferable, and suitable metals such as tin, magnesium, indium, calcium, aluminum, silver and the like, and alloys thereof are used. Examples thereof include low work function alloy electrodes such as a magnesium-silver alloy, a magnesium-indium alloy, an aluminum-lithium alloy and the like.

Formation of a cathode 7 can be performed by the similar methods to those for an anode 2. In addition, a film thickness is usually the same degree as that for an anode 2.

Lamination of a metal layer which has a high work function and is stable to the air on the surface of the cathode for the purpose of protecting a cathode 7 consisting of a low work function metal, is effective for increasing the stability of a device. For this purpose, metals such as aluminum, silver, copper, nickel, chrome, gold, platinum and the like are used. Further, insertion of extremely thin insulating films (0.1 to 5 nm) such as LiF, $MgF_2$, $Li_2O$ and the like into an interface between a cathode 7 and a light-emitting layer 5 or an electron transporting layer 6 is also an effective method for improving the efficiency of a device (Appl. Phys. Ltt., 70, 152, (1997)), JP-A No. 10-74586, IEEE Trans. Electron Devices, 44, 1245 (1997)).

FIGS. 1 to 3 show one example of the device structures adopted in the invention, and the invention is not limited to these structures at all. For example, the structure reverse to FIG. 1, that is, lamination of a cathode 7, a light-emitting layer 5, a hole injecting layer 3 and an anode 2 on a substrate 1 in this order is possible. As described above, it is also possible to dispose the present organic EL device between two substrates, one of which has the high transparency. Similarly, also regarding the structures shown in FIG. 2 and FIG. 3, it is possible to laminate the aforementioned constituent layers into the reverse structure. Further, in order to enhance a life of this device, the whole of a device may be sealed with a material such as a resin, a metal and the like to form a sealing layer for protecting from the air and water, or to work a device itself in the vacuum system.

EXAMPLES

The present invention will be explained in detail by way of Examples below, but the present invention is not limited to them. In the following explanation, "part" means "part by mass" at every occurrence.

Synthesis Example 1

Exemplified Compound 113

Figure 4:
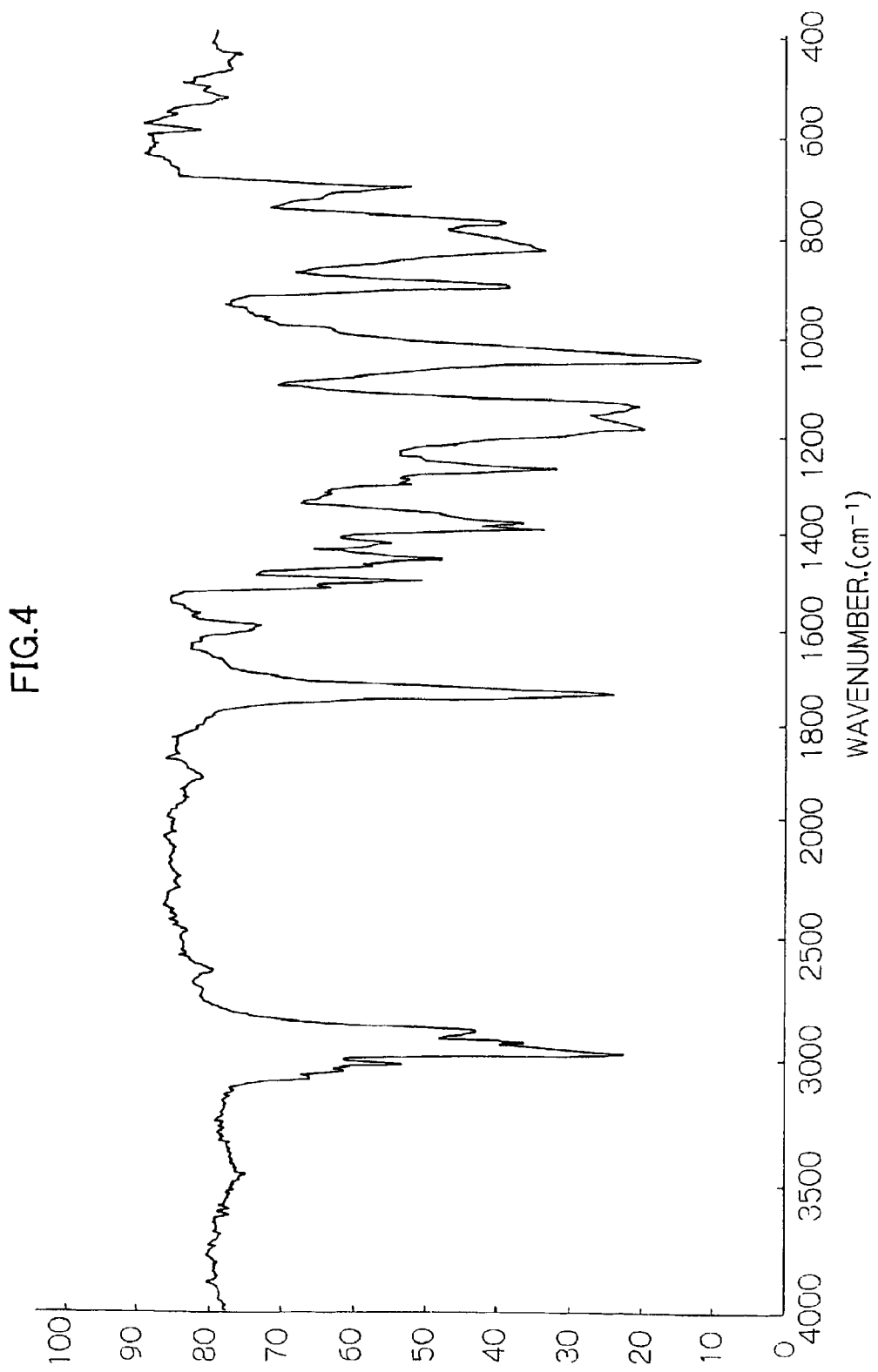
FIG. 4 is infra-red absorbing spectrum of an exemplified compound 113.

An exemplified compound 113 used in the following Examples 6 and 7 was obtained as follows:
64 g of a compound represented by the following structural formula (B), 28 g of potassium carbonate, 68 g of 3-iodopropylmethyldiisopropoxysilane and 700 ml of N,N-dimethylformamide were placed in a flask having a volume of 1 L, and heated to stir at 90° C. for 4 hours under a nitrogen stream. After completion of the reaction, the reaction solution was poured in 5 L of water, extracted with toluene, and dried by anhydrous sodium sulfate. This was purified by silica gel column chromatography to obtain 54 g of the compound represented by the following structural formula (113). Infra-red (IR) spectrum of this compound is shown in FIG. 4.

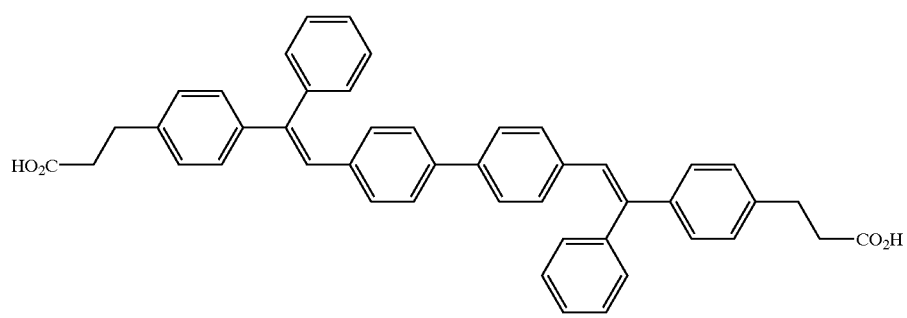

(B)

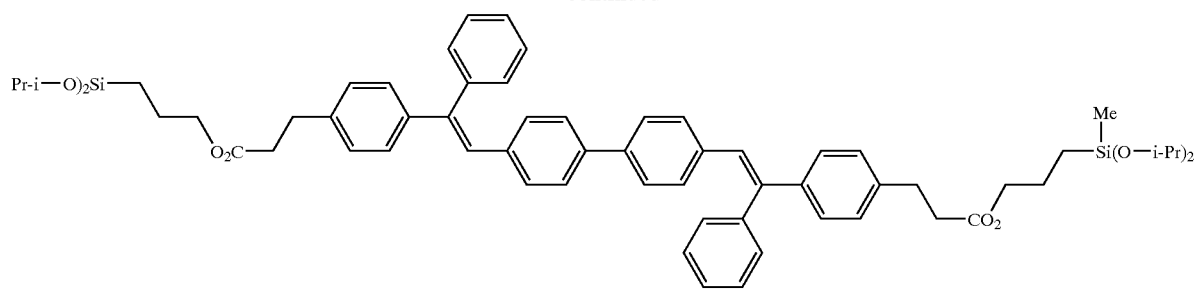

(113)

Example 1

First, a glass substrate provided with an ITO film having a thickness of 150 nm was prepared, and washed with oxygen plasma for 30 seconds using a plasma washing machine (BPI, manufactured by SAMCO International, Inc.). 1 part of an exemplified compound (81) was dissolved in a mixed solution of 5 parts of isopropyl alcohol, 3 parts of tetrahydrofuran and 0.2 part of distilled water, 0.5 part of an ion exchange resin (Amberlist 15E) was added thereto, and the mixture was stirred at room temperature to perform hydrolysis for 24 hours. After the ion exchange resin was filtered, 0.05 part of aluminum trisacetylacetonate was added to dissolve it. This solution was spin-coated on the surface of the aforementioned glass substrate at a rotation number of 300 rpm, heated at 170° C. for 1 hour and cured to form a hole injecting transporting layer having a thickness of 150 nm (as measured by a needle contact type film thickness measuring equipment). Then, tris(8-hydroxyquinoline)aluminum (Alq) as a material for a light-emitting layer was vacuum-deposited on the surface of this hole injecting transporting layer at 50 nm, and a magnesium-silver alloy electrode was vapor-deposited on the surface of a light-emitting layer at a thickness of 200 nm to prepare an organic EL device 1.

Using the ITO electrode of the organic EL device as an anode and the magnesium-silver alloy electrode as a cathode, 10 V of voltage was applied and a luminance was measured. In addition, voltage was set so that an initial luminance was 100 cd/m$^2$, and a time till a luminance was reduced to 80 cd/m$^2$ while voltage is maintained, and circumstances of occurrence of a dark spot upon this, were examined.

Measurement of the luminance was performed at room temperature, and the results are shown in Table 19.

Example 2

0.5 part of an exemplified compound (75) and 0.01 part of an exemplified compound (103) were dissolved in a mixed solution of 5 parts of isopropyl alcohol, 3 parts of tetrahydrofuran and 0.1 part of distilled water, 0.1 part of an ion exchange resin (Amberlist 15E) was added thereto, and the mixture was stirred at room temperature to perform hydrolysis for 24 hours. After the ion exchange resin was filtered, 0.01 part of aluminum trisacetylacetonate was added to dissolve it. As in Example 1, the above solution was spin-coated on the surface of a hole injecting-transporting layer at a rotation number of 300 rpm using a glass substrate prepared to the state in which the hole injecting-transporting layer was provided between, heated at 170° C. for 1 hour and cured to form a light-emitting layer having a thickness of 50 nm (as measured by a needle contact type film thickness measuring equipment). Then, tris(8-hydroxyquinoline) aluminum (Alq) was vacuum-deposited on the surface of this light-emitting layer at a thickness of 50 nm to form an electron transporting layer. Further, a magnesium-silver alloy electrode was deposited on the surface of this electron transporting layer at a thickness of 200 nm to prepare an organic EL device 2.

The aforementioned organic EL device 2 was evaluated as in Example 1. The results are shown in Table 19.

Example 3

50 mg of a polymer, CTP-1 represented by the following structure (a molecular weight is 56000 in a mass average molecular weight (Mw) on the basis of styrene conversion; oxidation potential of a monomer is 0.79 V relative to a saturated calomel electrode (SCE)) and 5 mg of tris(4-bromophenyl)ammonium hexachloroantimonate (TBAHA) were dissolved in 1 ml of dichloromethane. This solution was spin-coated on the surface of a glass substrate after washing used in Example 1 at a rotation number of 1000 rpm, and heated at 120° C. for 1 hour to form a hole injecting-transporting layer having a thickness of 700 nm (as measured by a needle contact type film thickness measuring equipment). Further, as in Example 2, a light-emitting layer, an electron transporting layer and a cathode were formed on this surface to prepare an organic EL device 3.

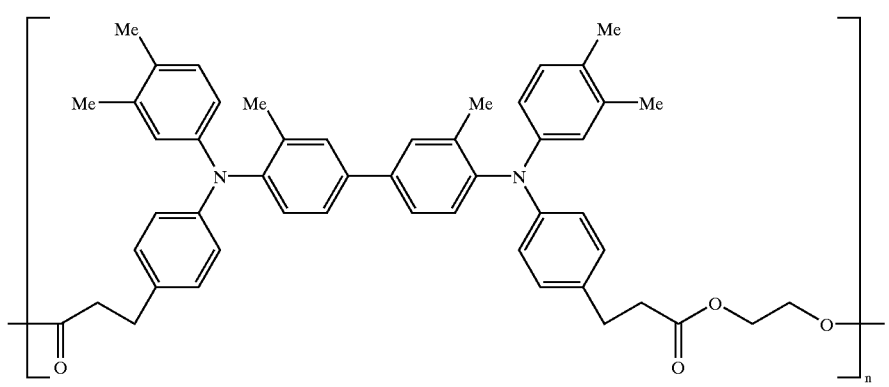

CTP-1

The aforementioned organic EL device 3 was evaluated as in Example 1. The results are shown in Table 19.

Example 4

10 mg of poly[2-methoxy-5-(2-ethylhexyloxy)-1,4-phenylenevinylene] was dissolved in 1 ml of dichloromethane. As in Example 1, the aforementioned solution was spin-coated on the surface of a hole injecting layer at a rotation number of 1000 rpm using a glass substrate prepared to the state in which the hole injecting-transporting layer was provided, heated at 120° C. for 1 hour to form a light-emitting layer having a thickness of 60 nm. Further, on the surface thereof, a calcium electrode was deposited at a thickness of 300 nm to prepare an organic EL device 4.

The aforementioned EL device 4 was evaluated as in Example 1. The results are sown in Table 19.

Example 5

0.05 g of the polymer (CTP-1) used in Example 3 was dissolved in 2 ml of dichloromethane. This solution was spin-coated on the surface of a glass substrate after washing used in Example 1 at a rotation number of 1000 rpm, heated at 120° C. for 1 hour, to form a hole injecting-transporting layer having a thickness of 200 nm (as measured by a needle contact type film thickness measuring equipment). On this surface, as in Example 2, a light-emitting layer was formed and, further on the surface thereof, a magnesium-silver alloy electrode was vacuum-deposited at a thickness of 200 nm to prepare an organic EL device 5.

The aforementioned EL device 5 was evaluated as in Example 1. The results are sown in Table 19.

Example 6

1 part of an exemplified compound (81) was dissolved in a mixed solution of 5 parts of isopropyl alcohol, 3 parts of tetrahydrofuran and 0.2 part of distilled water, 0.5 part of an ion exchange resin (Amberlist 15E) was added thereto, and the mixture was stirred at room temperature to perform hydrolysis for 24 hours. After the ion exchange resin was filtered, 0.05 part of aluminum trisacetylacetonate was added to dissolve it. This solution was spin-coated on the surface of a glass substrate after washing used in Example 1 at a rotation number of 300 rpm, heated at 170° C. for 1 hour and cured, to form a hole injecting-transporting layer having a thickness of 150 nm (as measured by a needle contact type film thickness measuring equipment). Then, 1 part of the aforementioned exemplified compound (113) was dissolved in a mixed solution of 5 parts of isopropyl alcohol, 3 parts of tetrahydrofuran and 0.2 part of distilled water, 0.5 part of an ion exchange resin (Amberlist 15E) was added thereto, and the mixture was stirred at room temperature to perform hydrolysis for 24 hours. After the ion exchange resin was filtered, 0.05 part of aluminum trisacetylacetonate was added to dissolve it. This solution was spin-coated on the surface of the aforementioned hole injecting-transporting layer at a rotation number of 500 rpm, heated at 170° C. for 1 hour and cured to form a light-emitting layer having a thickness of 100 nm (as measured by a needle contact type film thickness measuring equipment). On the surface of this light-emitting layer, tris(8-hydroxyquinoline) aluminum (Alq) as a material for an electron transporting layer was vacuum-deposited at a thickness of 50 nm, and a magnesium-silver alloy electrode was deposited thereon at a thickness of 200 nm, to prepare an organic EL device 6.

The aforementioned organic EL device 6 was evaluated as in Example 1. The results are shown in Table 19.

Example 7

50 mg of the aforementioned CTP-1 and 5 mg of tris(4-bromophenyl)ammonium hexachloroantimonate (TBAHA) were dissolved in 1 ml of dichloromethane. This solution was spin-coated on the surface of a glass substrate after washing used in Example 1 at a rotation number of 1000 rpm, heated at 120° C. for 1 hour to form a hole injecting-transporting layer having a thickness of 700 nm (as measured by a needle contact type film thickness measuring equipment). Then, 1 part of the aforementioned exemplified compound (113) was dissolved in a mixed solution of 5 parts of isopropyl alcohol, 3 parts of tetrahydrofuran and 0.2 part of distilled water, 0.5 part of an ion exchange resin (Amberlist 15E) was added thereto, and the mixture was stirred at room temperature to perform hydrolysis for 24 hours. After the ion exchange resin was filtered, 0.05 part of aluminum trisacetylacetonate was added to dissolve it. This solution was spin-coated on the surface of the aforementioned hole injecting-transporting layer at a rotation number of 700 rpm, heated at 170° C. for 1 hour and cured to form an electron injecting light-emitting layer having a thickness of 60 nm (as measured by a needle contact type film thickness measuring equipment). On the surface of this electron injecting light-emitting layer, a magnesium-silver alloy electrode was deposited at a thickness of 200 nm, to prepare an organic EL device 7.

The aforementioned organic EL device was evaluated as in Example 1. The results are shown in Table 19.

COMPARATIVE EXAMPLE 1

According to the same manner as that of Example 2 except that a light-emitting layer was formed using the following compound (A) in place of the exemplified compound (75), an organic EL device was prepared and the same evaluation as that of Example 2 was performed. The results are shown in Table 19.

(A)

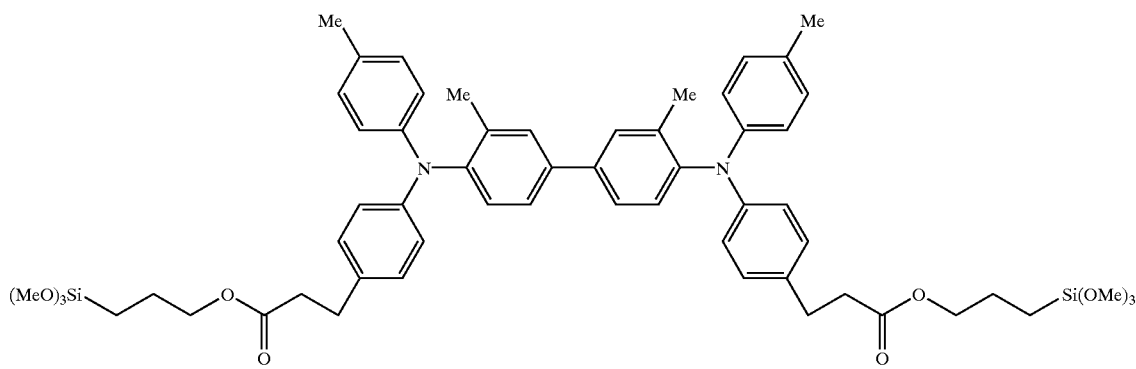

COMPARATIVE EXAMPLE 2

According to the same manner as that of Example 5 except that a light-emitting layer was formed using the aforementioned compound (A) in place of the exemplified compound (75), an organic EL device was prepared, and the same evaluation was performed as in Example 1. The results are shown in Table 19.

TABLE 19

|  | Initial luminance upon application of 10 V ($cd/m^2$) | Time to reduction to 80 $cd/cm^2$ (hr) | Circumstance of occurrence of dark spot upon reduction to 80 $cd/cm^2$ |
|---|---|---|---|
| Example 1 | 160 | 210 | Slightly occurred |
| Example 2 | 190 | 300 | Not occurred |
| Example 3 | 210 | 340 | Not occurred |
| Example 4 | 230 | 350 | Not occurred |
| Example 5 | 180 | 290 | Not occurred |
| Example 6 | 180 | 270 | Not occurred |
| Example 7 | 170 | 250 | Not occurred |
| Comparative Example 1 | 190 | 140 | Multiple times occurred |
| Comparative Example 2 | 180 | 100 | Multiple times occurred |

As described above, according to the invention, there can be provided an organic electroluminescence device which can be driven at a low voltage and a high light-emission efficiency, has the excellent heat resistance, and can maintain the stable emitting property for a long period of time. Further, the organic electroluminescence device can be easily obtained by lamination by solution coating.

What is claimed is:

1. An organic electroluminescence device, which comprises:
   a substrate, and
   at least one organic film layer held between an anode and a cathode, said at least one organic film layer and said anode and said cathode being formed on the surface of the substrate such that said at least one organic film layer is held by said anode and said cathode,
   wherein said at least one organic film layer comprises a cross-linked cured film containing compounds having a substituted silicon group having a hydrolyzable group, or a derivative thereof, and at least one of the compounds having a substituted silicon group having a hydrolyzable group is a compound represented by the following general formula (I):

General formula (I)

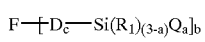

wherein F represents an organic group derived from a photofunctional compound, D represents a divalent tethering group, $R_1$ represents hydrogen, an alkyl group, or a substituted or unsubstituted aryl group, Q represents a hydrolyzable group, a is 1 or 2, b is an integer of 1 to 4, and c is 0 or 1, and
   wherein at least one of the compounds having a substituted silicon group having a hydrolyzable group or a derivative thereof has a light-emitting ability or an electrontransporting ability.

2. An organic electroluminescence device according to claim 1, wherein all the compounds having a substituted silicon group having the hydrolyzable group are a compound represented by the general formula (I).

3. An organic electroluminescence device according to claim 1, wherein the organic group F derived from a photofunctional compound, of the compound represented by the general formula (I) or a derivative thereof, is an organic group derived from a compound represented by the following general formula (II):

General formula (II)

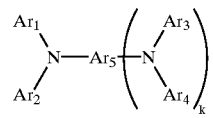

wherein $Ar_1$ to $Ar_4$ represent independently a substituted or unsubstituted aryl group, $Ar_1$ and $Ar_2$, and $Ar_3$ and $Ar_4$ may form a ring, respectively, $Ar_5$ represents a substituted or unsubstituted aryl group or arylene group, 1 to 4 of $Ar_1$ to $Ar_5$ have a bond which can bind to a binding group represented by $—D_c—Si(R_1)_{(3-a)}Q_a$ in the general formula (I), and k is 0 or 1.

4. An organic electroluminescence device according to claim 1, comprising two or more layers of a cross-linked cured film containing the compound having a substituted silicon group having a hydrolyzable group, or a derivative thereof, as said at least one organic film layer.

5. An organic electroluminescence device according to claim 1, wherein said at least one organic film layer comprises a hole injecting layer and a light-emitting layer, at least one of said hole injecting layer and said light-emitting layer comprises a cross-linked cured film containing the compound having a substituted silicon group having a hydrolyzable group, or a derivative thereof.

6. An organic electroluminescence device according to claim 1, wherein said at least one organic film layer comprises a hole injecting layer, a light-emitting layer, a hole transporting layer and/or an electron transporting layer, and at least one of said hole injecting layer, said light-emitting layer, said hole transporting layer and said electron transporting layer comprises a cross-linked cured film containing the compound having a substituted silicon group having a hydrolyzable group, or a derivative thereof.

7. An organic electroluminescence device according to claim 1, comprising at least one layer formed by solution coating and, wherein said at least one organic film layer comprising the cross-linked cured layer is formed as a layer under the at least one layer formed by solution coating.

8. An organic electroluminescence device according to claim 7, wherein the at least one layer formed by solution coating comprises a light-emitting layer, and all the organic film layers on a substrate side of the light-emitting layer are layers comprising the cross-linked cured film.

9. An organic electroluminescence device according to claim 1, wherein a in the general formula (I) is 2.

10. An organic electroluminescence device according to claim 1, wherein the compound having a substituted silicon group having a hydrolyzable group or the derivative thereof has a hole transporting ability.

11. An organic electroluminescence device according to claim 1, wherein at least one of the compounds having a substituted silicon group having a hydrolyzable group or the derivative thereof has a light-emitting ability.

12. An organic electroluminescence device according to claim 1, wherein at least one of the compounds having a substituted silicon group giving a hydrolyzable group or the derivative thereof has an electron transporting ability.

13. An organic electroluminescence device according to claim 3, wherein the organic group F is a group having a hole transporting ability or a group having a electron transporting ability.

14. An organic electroluminescence device according to claim 4, wherein the cross-linked cured film layers comprising the compound having a substituted silicon group having a hydrolyzable group or the derivative thereof comprise at least one of a hole injecting layer and a hole transporting layer.

15. An organic electroluminescence device, which comprises:

a substrate, and at least one organic film layer held between an anode and a cathode, said at least one organic film layer and said anode and said cathode being formed on the surface of the substrate such that said at least one organic film layer is held by said anode and said cathode, wherein said at least one organic film layer is a light-emitting layer comprising a cross-linked cured film containing compounds having a substituted silicon group having a hydrolyzable group, or a derivative thereof, and at least one of the compounds having a substituted silicon group having a hydrolyzable group is a compound represented by the following general formula (I):

General formula (I)

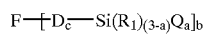

wherein F represents an organic group derived from a photofunctional compound, D represents a divalent tethering group, R$_1$ represents hydrogen, an alkyl group, or a substituted or unsubstituted aryl group, Q represents a hydrolyzable group, a is 1 or 2, b is an integer of 1 to 4, and c is 0 or 1.

16. An organic electroluminescence device according to claim 15, wherein the light-emitting layer serves also as an electron transporting layer.

17. An organic electroluminescence device according to claim 15, wherein the F is an organic group derived from a bisstyrylbenzene compound or a bisstyrylarylene compound.

18. An organic electroluminescence device according to claim 15, wherein the F is an organic group derived from a compound selected from the group consisting of a quinone-based compound, a fluorenone compound, a xanthone-based compound, a benzophenone-based compound, a benzothiazole-based compound, an oxadiazole-based compound, a phenanthroline-based compound, a cyanovinyl-based compound and an ethylene-based compound.

19. An organic electroluminescence device, which comprises:

a substrate, and at least one organic film layer held between an anode and a cathode, said at least one organic film layer and said anode and said cathode being formed on the surface of the substrate such that said at least one organic film layer is held by said anode and said cathode, wherein said at least one organic film layer is an electron transporting layer comprising a cross-linked cured film containing compounds having a substituted silicon group having a hydrolyzable group, or a derivative thereof, and at least one of the compounds having a substituted silicon group having a hydrolyzable group is a compound represented by the following general formula (I):

General formula (I)

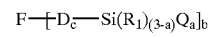

wherein F represents an organic group derived from a photofunctional compound, D represents a divalent tethering group, R$_1$ represents hydrogen, an alkyl group, or a substituted or unsubstituted aryl group, Q represents a hydrolyzable group, a is 1 or 2, b is an integer of 1 to 4, and c is 0 or 1.

20. An organic electroluminescence device according to claim 1, wherein at least one of the compounds having a substituted silicon group having a hydrolyzable group or the derivative thereof has a hole-transporting ability.

21. An organic electroluminescence device according to claim 1, comprising an additional organic film layer formed between said anode and said cathode, wherein said additional organic film layer is a hole transporting layer comprising a cross-linked cured film containing a compound having a substituted silicon group having a hydrolyzable group, or a derivative thereof, represented by the following general formula (I):

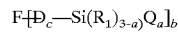   General formula (I)

wherein F represents an organic group derived from a photofunctional compound, D represents a divalent tethering group, R$_1$ represents hydrogen, an alkyl group, or a substituted or unsubstituted aryl group, Q represents a hydrolyzable group, a is 1 or 2, b is an integer of 1 to 4, and c is 0 or 1.

* * * * *